US012213337B2

(12) United States Patent
Son et al.

(10) Patent No.: US 12,213,337 B2
(45) Date of Patent: Jan. 28, 2025

(54) DISPLAY APPARATUS

(71) Applicant: Samsung Display Co., Ltd., Yongin-si (KR)

(72) Inventors: Youngran Son, Yongin-si (KR); Seunglyong Bok, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 488 days.

(21) Appl. No.: 17/644,303

(22) Filed: Dec. 14, 2021

(65) Prior Publication Data

US 2022/0190295 A1    Jun. 16, 2022

(30) Foreign Application Priority Data

Dec. 14, 2020   (KR) .......................... 10-2020-0174726

(51) Int. Cl.
  *H10K 50/844*   (2023.01)
  *H10K 59/12*    (2023.01)
  *H10K 59/40*    (2023.01)
  *H10K 59/65*    (2023.01)

(52) U.S. Cl.
  CPC .......... *H10K 50/844* (2023.02); *H10K 59/12* (2023.02); *H10K 59/40* (2023.02); *H10K 59/65* (2023.02)

(58) Field of Classification Search
  CPC ... H10K 50/805–828; H10K 50/11–18; H10K 59/88; H10K 59/82; H10K 59/60–65; H10K 59/12; H10K 59/126; H10K 59/873–8731; H10K 2102/341
  See application file for complete search history.

(56) References Cited

U.S. PATENT DOCUMENTS

| 10,205,122 | B2  | 2/2019  | Choi et al. |
| 10,454,067 | B2  | 10/2019 | Seo et al.  |
| 10,840,478 | B2  | 11/2020 | Han et al.  |
| 2018/0061907 | A1* | 3/2018 | Kim ........................ H10K 50/11 |

(Continued)

FOREIGN PATENT DOCUMENTS

| CN | 109802052 | 5/2019 |
| CN | 111293148 | 6/2020 |

(Continued)

*Primary Examiner* — Mohammad A Rahman
*Assistant Examiner* — Eric Manuel Mulero Flores
(74) *Attorney, Agent, or Firm* — Lewis Roca Rothgerber Christie LLP

(57) ABSTRACT

A display apparatus includes a substrate having an opening, a display area around the opening, and a middle area between the opening and the display area, a light-emitting element in the display area, the light-emitting element comprising a pixel electrode, an opposite electrode, and an intermediate layer between the pixel electrode and the opposite electrode, and a disconnection portion in the middle area, the disconnection portion including a first stack structure and a second stack structure on the first stack structure. A 1-1st sub-layer, a 1-2nd sub-layer, and a 1-3rd sub-layer are sequentially stacked in the first stack structure. A 2-1st sub-layer, a 2-2nd sub-layer, and a 2-3rd sub-layer are sequentially stacked in the second stack structure. The intermediate layer and the opposite electrode extend from the display area to the middle area, the intermediate layer and the opposite electrode being disconnected at the disconnection portion.

18 Claims, 13 Drawing Sheets

(56) References Cited

U.S. PATENT DOCUMENTS

2020/0303677 A1     9/2020  Lee et al.
2022/0013601 A1*    1/2022  Deng .................... H10K 59/124
2022/0077423 A1*    3/2022  Zhang .................. H10K 59/131

FOREIGN PATENT DOCUMENTS

| KR | 10-0708856      | 4/2007  |
|----|-----------------|---------|
| KR | 10-2020-0037025 | 4/2020  |
| KR | 10-2020-0113092 | 10/2020 |

* cited by examiner

DISPLAY APPARATUS

CROSS-REFERENCE TO RELATED APPLICATION

This application claims priority to and the benefit of Korean Patent Application No. 10-2020-0174726, filed on Dec. 14, 2020, in the Korean Intellectual Property Office (KIPO), the entire content of which is incorporated by reference herein.

BACKGROUND

1. Field

One or more embodiments relate to a display apparatus, and more particularly, to a display apparatus including a transmission area.

2. Description of the Related Art

Recently, display apparatuses have been used for various purposes. Also, display apparatuses have become thin and lightweight and thus the range of use thereof has expanded.

As an area of a display area in a display apparatus is extended, various functions connected or linked to the display apparatus are added. As a method of extending an area of the display area and adding various functions thereto, research has been conducted into a display apparatus having an area used to add various functions within a display area instead of just having an image display area.

SUMMARY

In display apparatuses according to the related art, defects may be generated due to moisture permeation.

Aspects of one or more embodiments of the present disclosure are directed towards a display apparatus having improved moisture permeation-prevention (or moisture permeation-reduction) performance. However, these objectives or aspects are just examples, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate having an opening, a display area around the opening, and a middle area between the opening and the display area, a light-emitting element in the display area, the light-emitting element including a pixel electrode, an opposite electrode, and an intermediate layer between the pixel electrode and the opposite electrode, and a disconnection portion in the middle area, the disconnection portion including a first stack structure and a second stack structure on the first stack structure. A 1-1st sub-layer, a 1-2nd sub-layer, and a 1-3rd sub-layer are sequentially stacked. A 2-1st sub-layer, a 2-2nd sub-layer, and a 2-3rd sub-layer are sequentially stacked in the second stack structure. The intermediate layer and the opposite electrode extend from the display area to the middle area, the intermediate layer and the opposite electrode being disconnected at the disconnection portion.

The first stack structure may have a first concave portion in which the 1-2nd sub-layer is dented toward a center of the 1-2nd sub-layer. The second stack structure may have a second concave portion in which the 2-2nd sub-layer is dented toward a center of the 2-2nd sub-layer.

The intermediate layer and the opposite electrode may be disconnected in an inner portion of the first concave portion or an inner portion of the second concave portion.

The intermediate layer and the opposite electrode may each have a thickness that decreases toward the inner portion of the first concave portion or the inner portion of the second concave portion.

The intermediate layer may include at least one of a hole transport layer, a hole injection layer, an electron transport layer, or an electron injection layer.

A width of the 1-2nd sub-layer may be less than a width of the 1-1st sub-layer and a width of the 1-3rd sub-layer, and a width of the 2-2nd sub-layer may be less than a width of the 2-1st sub-layer and a width of the 2-3rd sub-layer.

The width of the 2-1st sub-layer may be less than the width of the 1-3rd sub-layer.

The display apparatus may further include a thin-film transistor in the display area, the thin-film transistor including a semiconductor layer, a gate electrode overlapping the semiconductor layer, and a source electrode and a drain electrode that are electrically connected to the semiconductor layer. At least one of the source electrode or the drain electrode includes a 1-1st metal layer, a 1-2nd metal layer on the 1-1st metal layer, and a 1-3rd metal layer on the 1-2nd metal layer.

The 1-1st sub-layer and the 1-1st metal layer may include a same material as each other. The 1-2nd sub-layer and the 1-2nd metal layer may include a same material as each other. The 1-3rd sub-layer and the 1-3rd metal layer may include a same material as each other.

The display apparatus may further include a contact metal layer on the thin-film transistor, the contact metal layer electrically connected to the source electrode or the drain electrode. The contact metal layer includes a 2-1st metal layer, a 2-2nd metal layer on the 2-1st metal layer, and a 2-3rd metal layer on the 2-2nd metal layer.

The 2-1st sub-layer and the 2-1st metal layer may include a same material as each other. The 2-2nd sub-layer and the 2-2nd metal layer may include a same material as each other. The 2-3rd sub-layer and the 2-3rd metal layer may include a same material as each other.

The disconnection portion may further include a third stack structure on the second stack structure. A 3-1st sub-layer, a 3-2nd sub-layer, and a 3-3rd sub-layer are sequentially stacked in the third stack structure.

The first stack structure may have a first concave portion in which the 1-2nd sub-layer is dented toward a center of the 1-2nd sub-layer. The second stack structure may have a second concave portion in which the 2-2nd sub-layer is dented toward a center of the 2-2nd sub-layer. The third stack structure may have a third concave portion in which the 3-2nd sub-layer is dented toward a center of the 3-2nd sub-layer.

The intermediate layer and the opposite electrode may be disconnected in an inner portion of the first concave portion, an inner portion of the second concave portion, or an inner portion of the third concave portion.

The intermediate layer and the opposite electrode may each have a thickness that decreases toward the inner portion of the first concave portion, the inner portion of the second concave portion, or the inner portion of the third concave portion.

A width of the 1-2nd sub-layer may be less than a width of the 1-1st sub-layer and a width of the 1-3rd sub-layer. A width of the 2-2nd sub-layer may be less than a width of the 2-1st sub-layer and a width of the 2-3rd sub-layer. A width of the 3-2nd sub-layer may be less than a width of the 3-1st sub-layer and a width of the 3-3rd sub-layer.

The width of the 2-1st sub-layer may be less than the width of the 1-3rd sub-layer.

The width of the 3-1st sub-layer may be less than the width of the 2-3rd sub-layer.

The pixel electrode may include a first electrode layer, a second electrode layer on the first electrode layer, and a third electrode layer on the second electrode layer.

The first electrode layer and the 3-1st sub-layer may include a same material as each other. The second electrode layer and the 3-2nd sub-layer may include a same material as each other. The third electrode layer and the 3-3rd sub-layer may include a same material as each other.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
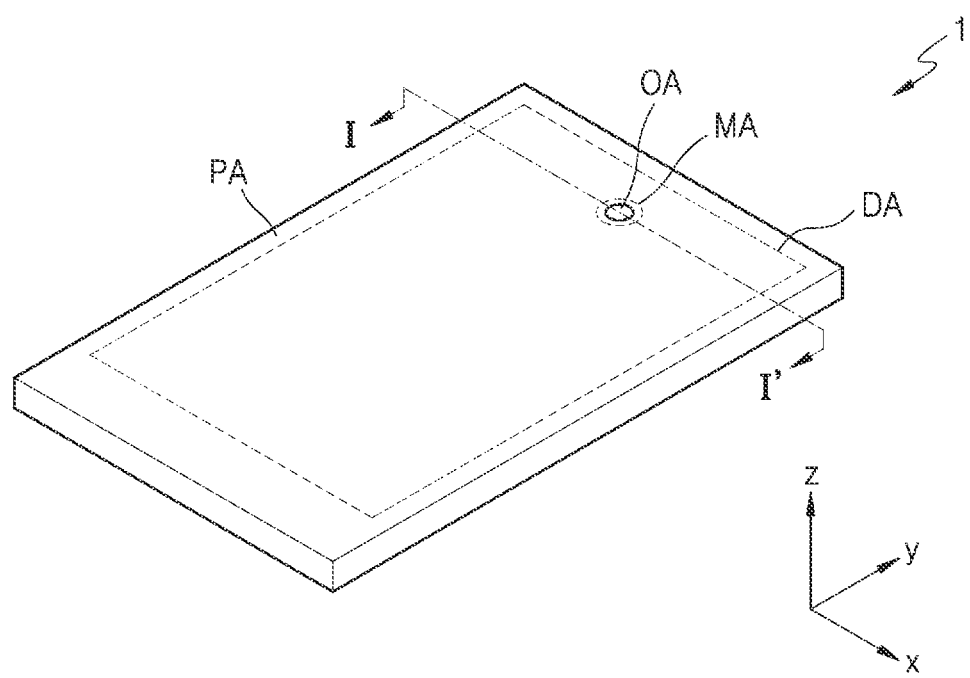
FIG. 1 is a schematic perspective view of a portion of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the present disclosure may have various modifications and several embodiments, embodiments are shown in the drawings and will be described in more detail. The effects and features of the present disclosure, and ways to achieve them will become apparent by referring to embodiments that will be described later in more detail with reference to the drawings. However, the present disclosure is not limited to the following embodiments but may be embodied in various forms.

Hereinafter, embodiments of the present disclosure will be described in more detail with reference to the accompanying drawings, and in the description with reference to the drawings, like reference numerals refer to like elements and redundant descriptions thereof will be omitted.

It will be understood that although the terms "first," "second," etc., may be used herein to describe various components, these components should not be limited by these terms. These components are only used to distinguish one component from another.

In the embodiments below, the singular forms "a," "an," and "the" are intended to include the plural forms as well, unless the context clearly indicates otherwise.

In the present specification, it is to be understood that the terms such as "comprising," "including," or "having" are intended to indicate the existence of the features or components disclosed in the specification, and are not intended to preclude the possibility that one or more other features or components may be added.

In the embodiments below, it will be understood when a portion such as a layer, an area, or an element is referred to as being "on" or "above" another portion, it can be directly on or above the other portion, or one or more intervening portions may also be present.

Also, in the drawings, for convenience of description, sizes of elements may be exaggerated or contracted. For example, because sizes and thicknesses of components in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order.

In the present specification, "A and/or B" refers to A, B, or A and B. In addition, "at least one selected from A and B", "any one selected from A and B" or the like refers to A, B, or A and B.

In the embodiments below, it will be understood that when a portion such as a layer, an area, or an element is referred to as being "connected" to another portion, it can be directly connected to the other portion, and/or one or more intervening portions may also be present. For example, throughout the specification, it will be understood when a portion such as a layer, an area, or an element is referred to as being "electrically connected" to another portion, it can be directly electrically connected to the other portion, and/or it can be indirectly electrically connected with one or more intervening portions therebetween.

An x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a portion of a display apparatus 1 according to an embodiment.

Referring to FIG. 1, the display apparatus 1 according to an embodiment may include an opening area OA (or a first area) and a display area DA (or a second area) around (e.g., surrounding) the opening area OA. A plurality of pixels may be arranged in the display area DA, and an image may be displayed on the display area DA through the pixels. The opening area OA may be entirely surrounded by the display area DA. However, the present disclosure is not limited thereto.

A middle area MA (or a third area) may be between the opening area OA and the display area DA. The middle area MA may be a non-display area where pixels are not arranged, and wirings that detour the opening area OA may be arranged in the middle area MA. Like the middle area MA, a peripheral area PA (or a fourth area) around (e.g., surrounding) the display area DA may be a non-display area where pixels are not arranged, and various suitable types (or kinds) of wirings and internal circuit(s) may be arranged in the peripheral area PA.

In FIG. 1, the opening area OA is illustrated as being arranged in a middle portion of the display area DA in a width direction (e.g., an x-direction) of the display apparatus 1. However, according to an embodiment, the opening area OA may also be offset from the middle portion and arranged on the left or the right in the width direction of the display apparatus 1. Also, the opening area OA may be arranged at various suitable locations, for example, in an upper portion, in a middle portion, or in a lower portion in a length direction (e.g., a y-direction) of the display apparatus 1. As shown in FIG. 1, the width direction (e.g., the x-direction) of the display apparatus 1, the length direction (e.g., the y-direction) of the display apparatus 1, and a thickness direction (e.g., the z-direction) of the display apparatus 1 may cross each other.

Also, while FIG. 1 illustrates the display apparatus 1 including a single opening area OA, according to an embodiment, the display apparatus 1 may include more than a single opening area OA (e.g., multiple opening areas OA).

Figure 2A:
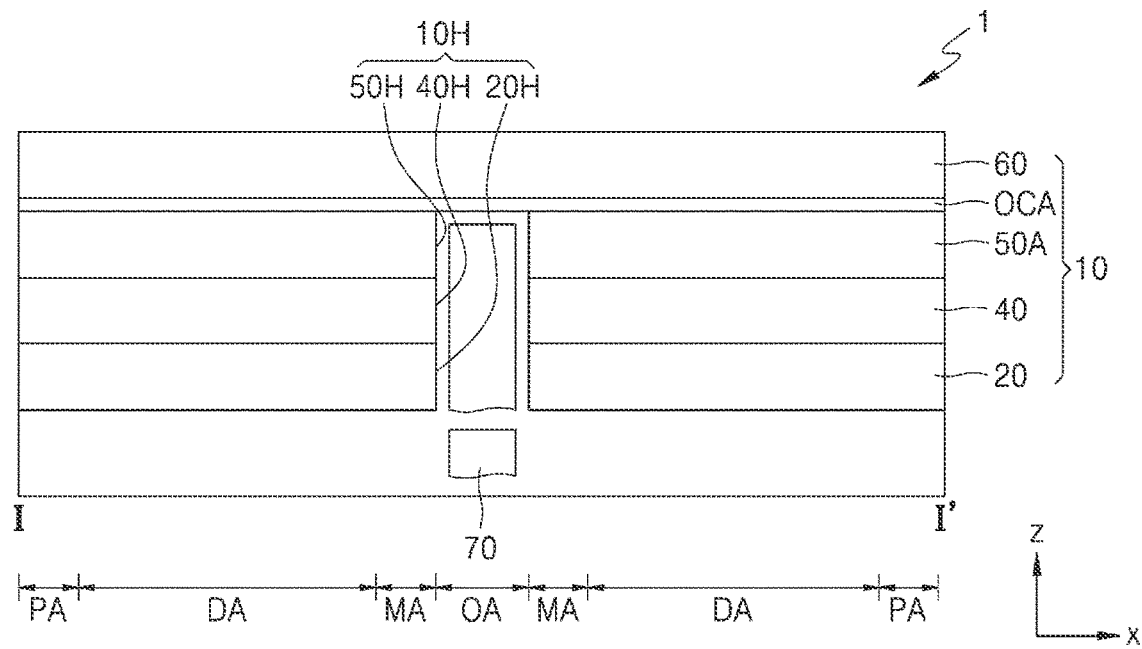
FIG. 2A is a schematic cross-sectional view of a portion of a display apparatus according to an embodiment.
Figure 2B:
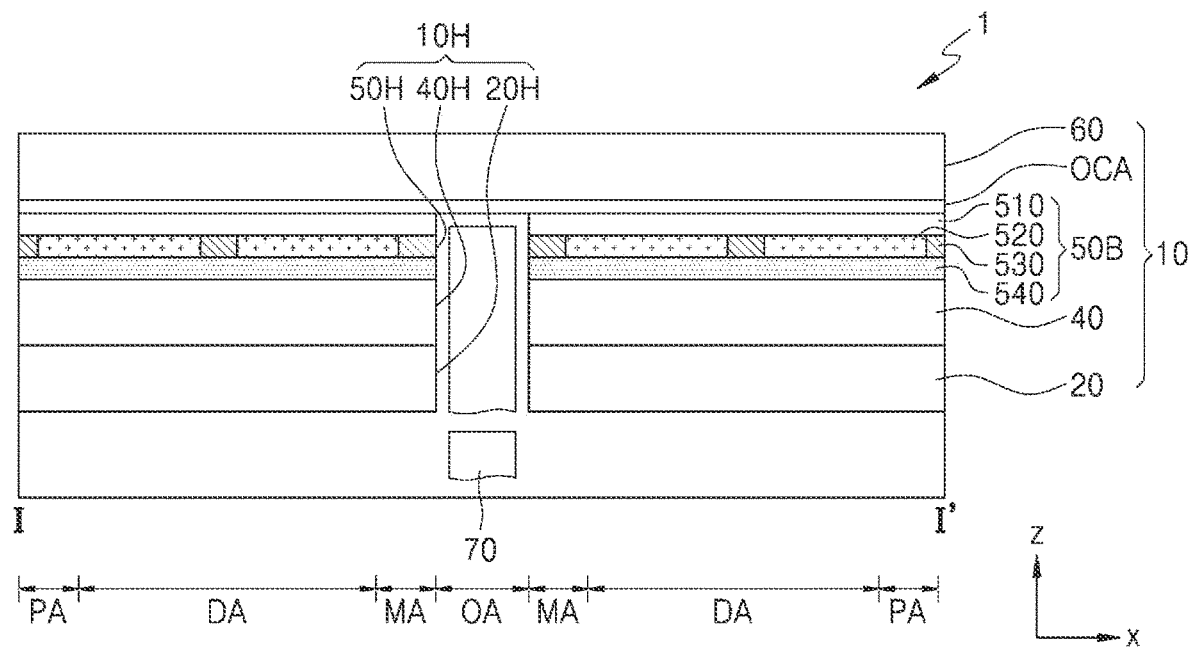
FIG. 2B is a schematic cross-sectional view of a portion of a display apparatus according to another embodiment.

FIG. 2A is a schematic cross-sectional view of a portion of the display apparatus 1 according to an embodiment, and FIG. 2B is a schematic cross-sectional view of a portion of the display apparatus 1 according to another embodiment. FIGS. 2A and 2B may correspond to cross-sectional views of the display apparatus 1 taken along the line I-I' FIG. 1.

Referring to FIGS. 2A and 2B, the display apparatus 1 may include a display panel 10 and a component 70 overlapping (e.g., overlapping in the z-direction or the thickness direction of the display apparatus 1) an opening 10H of the display panel 10. According to an embodiment, the display panel 10 and the component 70 may be accommodated in a housing.

The display panel 10 may include a display element layer 20, an input sensing layer 40, an optical functional layer 50 (e.g., see FIG. 6), and a cover window 60.

The display element layer 20 may include display elements emitting light to display an image. The display elements may include a light-emitting element. According to an embodiment, the light-emitting element may include an organic light-emitting diode including an organic emission layer. According to another embodiment, the light-emitting element may include an inorganic light-emitting diode including an inorganic material. The inorganic light-emitting diode may include a PN diode including materials based on an inorganic material semiconductor. According to another embodiment, the light-emitting element may include quantum dots as an emission layer. Hereinafter, for convenience of description, description will focus on an organic light-emitting diode included as a light-emitting element.

The input sensing layer 40 may acquire coordinate information according to an external input, for example, a touch event. The input sensing layer 40 may include a sensing electrode and a signal line (trace line) connected to the sensing electrode. The input sensing layer 40 may be arranged on the display element layer 20. The input sensing layer 40 may be used to sense an external input by using a mutual cap method (mutual capacitance method) and/or a self-cap method (self-capacitance method), but is not limited thereto.

The input sensing layer 40 may be formed on (e.g., directly on) the display element layer 20 or may be separately formed and combined to the display element layer 20 by using an adhesive layer such as an optical clear adhesive (OCA). For example, the input sensing layer 40 may be formed continuously after an operation of forming the display element layer 20. In an embodiment, in the case where the input sensing layer 40 is separately formed and combined to the display element layer 20, the input sensing layer 40 may be on the display element layer 20 with the adhesive layer therebetween. According to an embodiment, an adhesive layer between the input sensing layer 40 and the display element layer 20 may be omitted. While the input sensing layer 40 is illustrated as being between the display element layer 20 and the optical functional layer 50 in FIGS. 2A and 2B, according to another embodiment, the input sensing layer 40 may also be arranged above the optical functional layer 50.

The optical functional layer 50 may include an anti-reflection layer. The anti-reflection layer may reduce a reflectance of light (e.g., external light) incident from the outside onto the display panel 10 through the cover window 60.

According to an embodiment, as illustrated in FIG. 2A, the anti-reflection layer may include an optical plate 50A including a phase retarder and/or a polarizer. The phase retarder may be a film-type (e.g., a film) or a liquid crystal-coating type (e.g., a liquid crystal-coating), and may include a λ/2 phase retarder and/or a λ/4 phase retarder. The polarizer may also be a film-type or a liquid crystal-type. The film-type polarizer may include an elongation-type synthetic resin film (e.g., an elongation synthetic resin film), and the liquid crystal coating-type polarizer may include liquid crystals arranged in a certain arrangement.

According to another embodiment, as illustrated in FIG. 2B, the anti-reflection layer may include a filter layer 50B including a black matrix and color filters. The filter layer 50B may include a base layer 510, color filters 520 on the base layer 510, a black matrix 530, and an overcoat layer 540.

The color filters 520 may be arranged by considering colors of light emitted from respective pixels of the display apparatus 1. For example, according to the color of light emitted from an organic light-emitting diode, the color filters 520 may have a red color, a green color or a blue color. The color filters 520 and the black matrix 530 may not be included in the opening area OA. For example, a layer including the color filters 520 and the black matrix 530 may have a hole corresponding to the opening area OA. A portion of the overcoat layer 540 may be at least partially filled in the hole. The overcoat layer 540 may include an organic material such as a resin, and the organic material may be transparent.

In some embodiments, the anti-reflection layer may include a destructive interference structure. The destructive interference structure may include a first reflective layer and a second reflective layer arranged at different layers from each other. First reflected light and second reflected light respectively reflected by the first reflective layer and the second reflective layer may undergo destructive interference, and accordingly, external light reflectance may be reduced.

The optical functional layer 50 may include a lens layer. The lens layer may improve an extraction efficiency of light emitted from the display element layer 20 or may reduce color chrominance. The lens layer may include a layer having a concave or convex lens shape, and/or a plurality of layers having different refractive indices. The optical functional layer 50 may include both the anti-reflection layer and the lens layer described above or one of these.

The display panel 10 may include the opening 10H corresponding to the opening area OA of the display apparatus 1. In this regard, referring to FIGS. 2A and 2B, the display element layer 20, the input sensing layer 40, and the optical functional layer 50 respectively include first through third openings (i.e., a first opening 20H, a second opening 40H, and a third opening 50H), and the first through third openings 20H, 40H, and 50H overlapping each other (e.g., overlapping each other in the z-direction or the thickness direction of the display apparatus 1) form the opening 10H of the display panel 10.

The first opening 20H may pass or extend through the display element layer 20 from an upper surface of the display element layer 20 to a lower surface of the display element layer 20, and the second opening 40H may pass or extend through the input sensing layer 40 from an upper surface of the input sensing layer 40 to a lower surface of the input sensing layer 40, and the third opening 50H may pass or extend through the optical functional layer 50 from an upper surface of the optical functional layer 50 to a lower surface of the optical functional layer 50.

The opening 10H of the display panel 10, for example, the first through third openings 20H, 40H, and 50H, may be located in the opening area OA to overlap each other (e.g., overlap each other in the z-direction or the thickness direction of the display apparatus 1). Sizes (or diameters) of the first through third openings 20H, 40H, and 50H may be identical to each other or different from each other.

According to another embodiment, at least one of the display element layer 20, the input sensing layer 40, or the optical functional layer 50 may not include an opening. For example, any one selected from the display element layer 20, the input sensing layer 40, and the optical functional layer 50, or any two selected from the display element layer 20, the input sensing layer 40, and the optical functional layer 50 may not (or may each not) include an opening.

The cover window 60 may be arranged above the optical functional layer 50. The cover window 60 may be bonded to the optical functional layer 50 by using an adhesive layer therebetween, such as a transparent OCA. The cover window 60 may include a glass material.

The opening area OA may be a type (or kind) of a component area (e.g., a sensor area, a camera area, a speaker area, etc.) where the component 70 used to add various suitable functions to the display apparatus 1 is located.

The component 70 may include an electronic element. In an embodiment, the component 70 may be an electronic element using light or sound. For example, the electronic element may include a sensor using light, such as an infrared sensor, a camera capturing an image by receiving light, a sensor outputting and sensing light or sound to measure a distance or recognize a fingerprint, a compact lamp emitting light, or a speaker outputting sound, or the like. The electronic element using light may use light of various suitable wavelength bands such as visible light, infrared light, ultraviolet light, and/or the like. The opening area OA may correspond to a transmission area through which light and/or sound output from the component 70 to the outside and/or proceeding from the outside to the electronic element may be transmitted.

As illustrated in FIGS. 2A and 2B, the cover window 60 and the adhesive layer that is under the cover window 60 and includes an OCA may not include an opening, unlike the display element layer 20, the input sensing layer 40, and the optical functional layer 50 according to an embodiment.

In some embodiments, when the display apparatus 1 is used as a smartwatch or a vehicle-use dashboard, the component 70 may be a member such as clock hands or a needle indicating certain information (e.g., a vehicle speed, etc.). In this case, in order that the component 70 such as a needle is exposed to the outside, the cover window 60 may include an opening located in the opening area OA, unlike the illustration of FIG. 1. Alternatively, also when the display apparatus 1 includes the component 70 such as a speaker, the cover window 60 may include an opening corresponding to the opening area OA.

Figure 3:
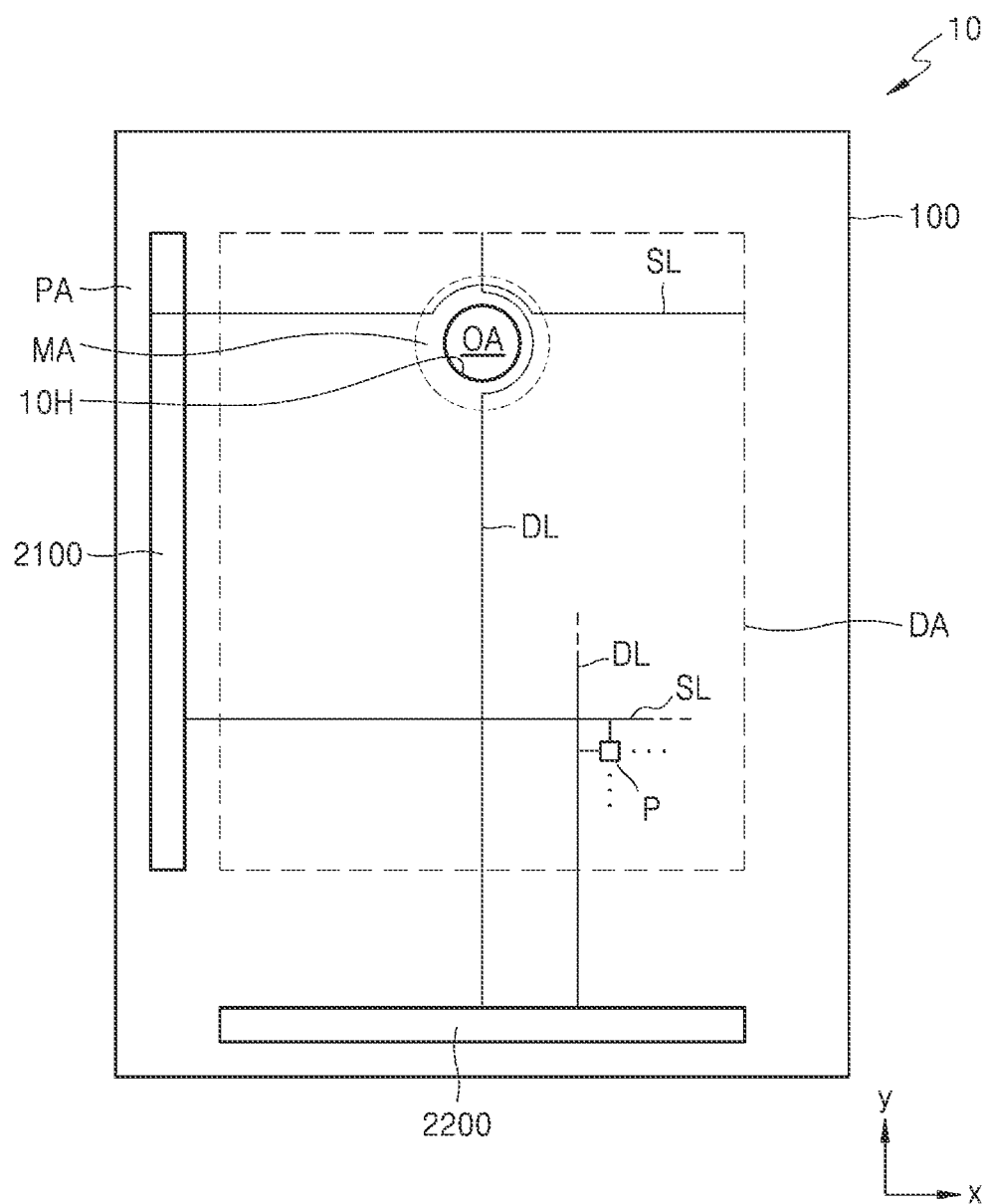
FIG. 3 is a schematic plan view of a portion of a display apparatus according to an embodiment.
Figure 4:
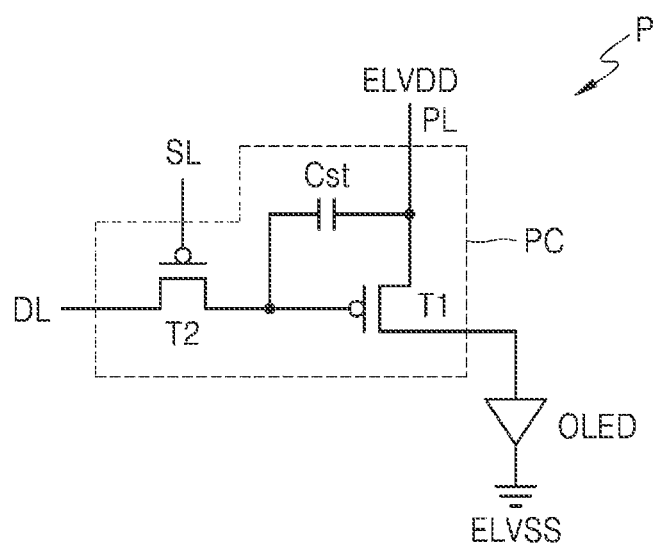
FIG. 4 is an equivalent circuit diagram of any one pixel included in a display apparatus according to an embodiment.

FIG. 3 is a schematic plan view of a portion of a display apparatus according to an embodiment, and FIG. 4 is an equivalent circuit diagram of any one pixel included in a display apparatus according to an embodiment.

Referring to FIG. 3, the display panel 10 may include the opening area OA, the display area DA, the middle area MA, and the peripheral area PA. The display panel 10 may include a plurality of pixels P arranged in the display area DA, and the display panel 10 may display an image by using light emitted from a light-emitting element of each pixel P, for example, red light, green light, or blue light.

As illustrated in FIG. 4, a light-emitting element of each pixel P may include an organic light-emitting diode OLED, and each organic light-emitting diode OLED may be connected (e.g., electrically connected) to a pixel circuit PC.

The pixel circuit PC may include a first thin-film transistor T1, a second thin-film transistor T2, and a storage capacitor Cst.

The second thin-film transistor T2 may be a switching thin-film transistor and be connected to a scan line SL and a data line DL, and may be configured to transfer a data voltage received from the data line DL to the first thin-film transistor T1, according to a switching voltage received from the scan line SL. The storage capacitor Cst may be connected to the second thin-film transistor T2 and a driving voltage line PL and may store a voltage corresponding to a difference between a voltage received from the second thin-film transistor T2 and a first power voltage ELVDD supplied to the driving voltage line PL.

The first thin-film transistor T1 may be a driving thin-film transistor and be connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light of a certain brightness, according to a driving current. An opposite electrode (e.g., cathode) of the organic light-emitting diode OLED may receive a second power voltage ELVSS.

While FIG. 4 describes the pixel circuit PC including two thin-film transistors and one storage capacitor, the present disclosure is not limited thereto. A number of thin-film transistors and a number of storage capacitors may be variously modified in a suitable manner according to a design of the pixel circuit PC.

Referring back to FIG. 3, the middle area MA may be around (e.g., surround) the opening area OA. The middle area MA is an area where a display element such as an organic light-emitting diode emitting light is not arranged, and signal lines providing a signal to the pixels P included around the opening area OA may pass through the middle area MA. For example, the data lines DL and/or the scan lines SL may cross the display area DA in a y-direction and/or an x-direction as illustrated in FIG. 3, and some of each of the data lines DL and/or the scan lines SL may detour the opening area OA in the middle area MA along or adjacent to an edge of the opening 10H of the display panel 10.

In the peripheral area PA, a scan driver 2100 providing a scan signal to each pixel P, a data driver 2200 providing a data signal to each pixel P, and a first main power line and a second main power line that respectively provide the first power voltage ELVDD (e.g., see FIG. 4) and the second power voltage ELVSS (e.g., see FIG. 4) may be arranged. While the data driver 2200 is arranged adjacent to one side of a substrate 100 in FIG. 3, according to another embodiment, the data driver 2200 may be arranged on a flexible printed circuit board connected (e.g., electrically connected) to a pad arranged at one side of the display panel 10.

Figure 5:
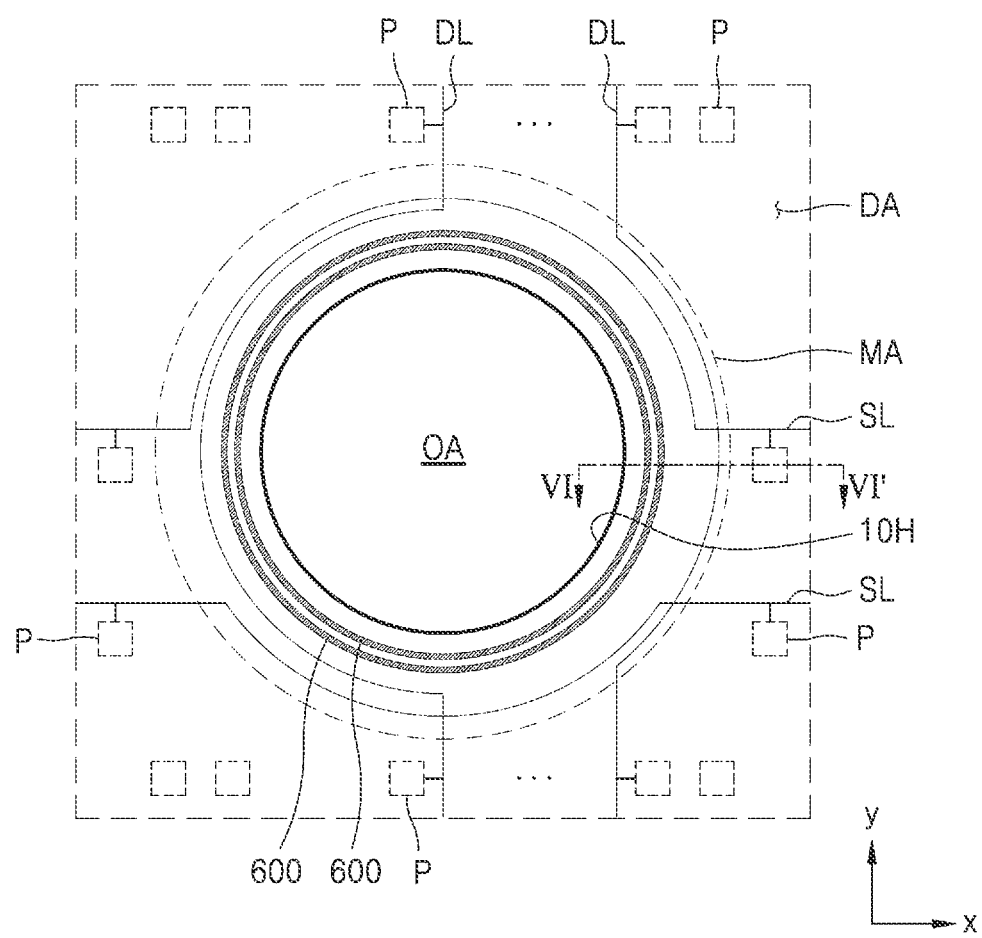
FIG. 5 is a schematic plan view of a portion of a display apparatus according to an embodiment.

FIG. 5 is a schematic plan view of a portion of a display apparatus according to an embodiment.

Referring to FIG. 5, pixels P may be arranged in the display area DA, and the middle area MA may be between the opening area OA and the display area DA. The pixels P adjacent to the opening area OA may be apart from (e.g., spaced from) each other with respect to the opening area OA in a plan view (e.g., on a plane define by the x-axis and y-axis). As illustrated in the plan view of FIG. 5, the pixels P may be arranged apart from (e.g., spaced from) each other above and below the opening area OA or on the left and the right of the opening area OA. As described above with reference to FIGS. 3 and 4, each pixel P uses light of a red color, a green color, and/or a blue color, the light being emitted from a light-emitting element, and thus, locations of the pixels P illustrated in FIG. 4 may correspond to locations of respective light-emitting elements. Thus, an arrangement of the pixels P arranged apart from (e.g., spaced from) each other with respect to the opening area OA in a plan view may indicate that the light-emitting elements are arranged apart from (e.g., spaced from) each other in a plan view with respect to the opening area OA. For example, in a plan view, the light-emitting elements may be arranged above and below the opening area OA in a plan view or on the left or right of the opening area OA.

Signal lines adjacent to the opening area OA, from among signal lines via which a signal is supplied to a pixel circuit connected to a light-emitting element of each pixel P, may detour the opening area OA. Some of the data lines DL from among the data lines DL passing by the display area DA may extend in a ±y direction such that a data signal is provided to pixels P respectively arranged above and below the opening area OA, with the opening area OA therebetween, and may detour along or adjacent to edges of the opening area OA and/or the opening 10H in the middle area MA. Some of the scan lines SL from among the scan lines SL passing by the display area DA may extend in a ±x direction such that a scan signal is provided to pixels P respectively arranged on the left and right of the opening area OA, with the opening area OA therebetween, and may detour along or adjacent to the edges of the opening area OA and/or the opening 10H in the middle area MA.

While the scan line SL is illustrated as detouring the opening area OA in the middle area MA in FIG. 5, the present disclosure is not limited thereto. According to another embodiment, scan lines SL may be separated or disconnected around the opening area OA, and a scan line SL arranged on the left of the opening area OA may receive a signal from the scan driver 2100 on the left of the display area DA as illustrated in FIG. 3, and the scan line SL on the right of the opening area OA may receive a signal from an additional scan driver arranged opposite the scan driver 2100 with respect to the display area DA according to an embodiment.

Disconnection portions 600 may be arranged in the middle area MA. The disconnection portions 600 may have a function of preventing or reducing damage to the light-emitting elements due to moisture flowing through the opening area OA. In more detail, the disconnection portions 600 may have a function of preventing or reducing penetration of moisture into the display area DA by disconnecting (or separating) a layer that may be used as a path of moisture, from among layers formed on the substrate 100 (e.g., see FIG. 6). For example, the disconnection portions 600 may disconnect at least some of organic material layers included in an intermediate layer 222 (e.g., see FIG. 6) and/or an opposite electrode 223 (e.g., see FIG. 6).

The disconnection portions 600 may be arranged to be around (e.g., entirely surround) the opening area OA. For example, the disconnection portions 600 may be arranged in a ring shape in the middle area MA. Also, the disconnection portions 600 may be apart from (e.g., spaced from) each other. While two disconnection portions 600 are illustrated in FIG. 5, the present disclosure is not limited thereto, and a display apparatus may include one disconnection portion 600 or three or more disconnection portions 600.

Figure 6:
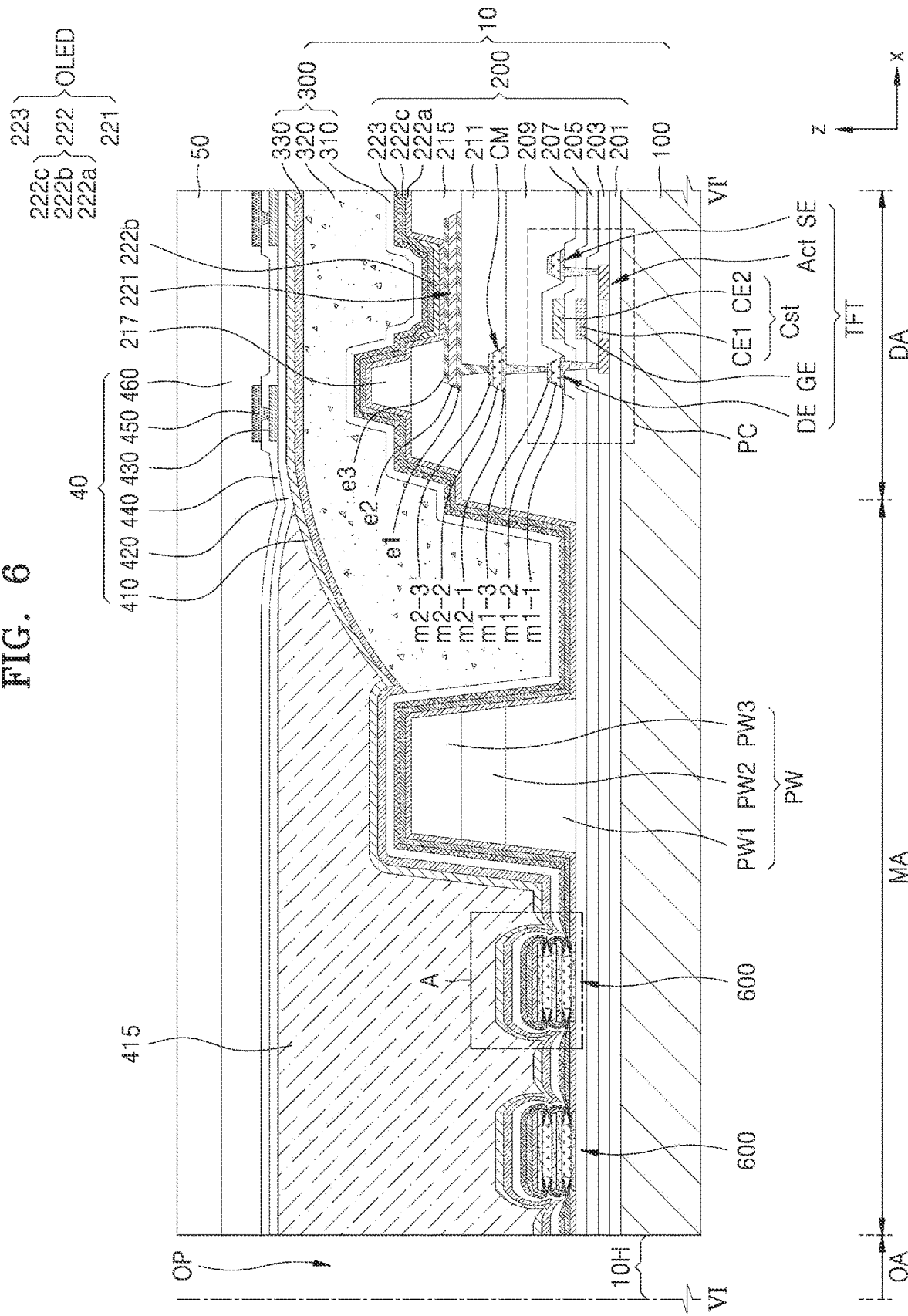
FIG. 6 is a schematic cross-sectional view of a portion of a display apparatus according to an embodiment.
Figure 7:
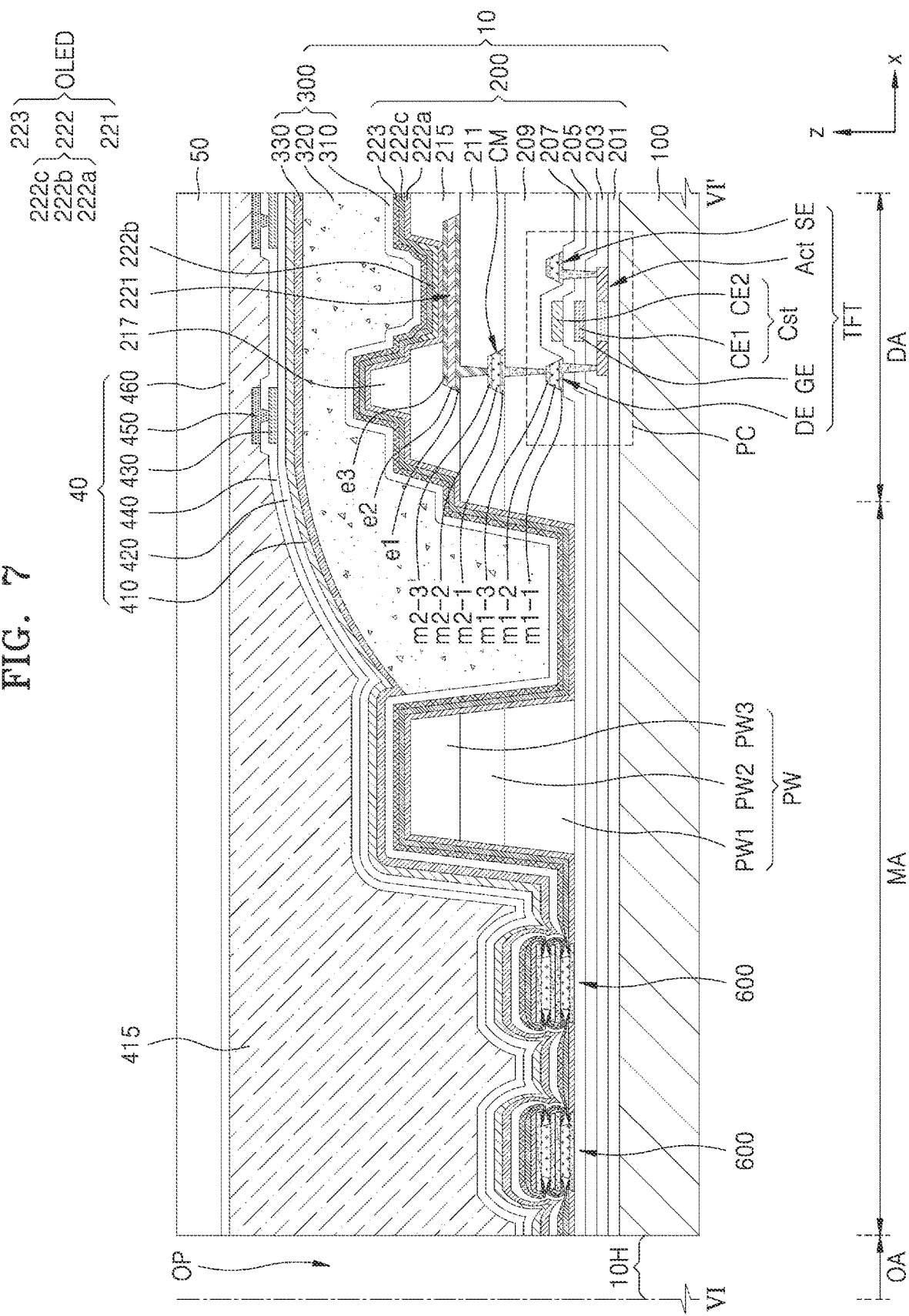
FIG. 7 is a schematic cross-sectional view of a portion of a display apparatus according to another embodiment.

FIG. 6 is a schematic cross-sectional view of a portion of the display apparatus according to an embodiment, and FIG. 7 is a schematic cross-sectional view of a portion of a display apparatus according to another embodiment.

As illustrated in FIG. 6, the display apparatus according to the embodiment may include the display panel 10, the input sensing layer 40 located on the display panel 10, and the optical functional layer 50 located on the input sensing layer 40. The display panel 10 may include the substrate 100, a display layer 200 on the substrate 100, and an encapsulation layer 300 on the display layer 200. The display panel 10 may include the opening 10H corresponding to the opening area OA. The opening 10H may pass or extend through the substrate 100, the display layer 200, and the encapsulation layer 300.

The substrate 100 may include glass, a metal, or a polymer resin. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. Various suitable modifications may also be made to the substrate 100; for example, the substrate 100 may have a multi-layer structure including two layers each including the above-described polymer resin and a barrier layer that is between the two layers and includes an inorganic material (e.g., silicon oxide, silicon nitride, or silicon oxynitride).

A buffer layer 201 preventing or reducing penetration of an impurity into a semiconductor layer Act of a thin-film transistor TFT may be formed on the substrate 100. The buffer layer 201 may include an inorganic insulating material such as silicon nitride, silicon oxynitride, and silicon oxide, and may have a single layer or a multi-layer structure including the inorganic insulating material described above.

The pixel circuit PC may be arranged on the buffer layer 201. The pixel circuit PC may include the thin-film transistor TFT and a storage capacitor Cst. The thin-film transistor TFT may include the semiconductor layer Act, a gate electrode GE, a source electrode SE, and a drain electrode DE. The thin-film transistor TFT of FIG. 6 is a top-gate type in which the gate electrode GE is arranged above the semiconductor layer Act, with a gate insulating layer 203 therebetween, but is not limited thereto. For example, the thin-film transistor TFT may be a bottom-gate type.

The semiconductor layer Act may include polysilicon. Alternatively, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), and/or the like, and may be formed as a multi-layer or single-layer structure including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or a hafnium oxide. The gate insulating layer 203 may have a single-layer or multi-layer structure including the above-described material.

The source electrode SE and the drain electrode DE may include a material having high conductivity. The source electrode SE and the drain electrode DE may include a conductive material including molybdenum (Mo), aluminum (Al), copper (Cu), titanium (Ti), and/or the like, and may be formed as a multi-layer or single-layer structure including the above material. For example, the source electrode SE and the drain electrode DE may each include a 1-1st metal layer m1-1, a 1-2nd metal layer m1-2, and a 1-3rd metal layer m1-3 that are stacked (e.g., sequentially stacked). For example, the 1-1st metal layer m1-1 may include titanium, the 1-2nd metal layer m1-2 may include aluminum, and the 1-3rd metal layer m1-3 may include titanium. That is, each of the source electrode SE and the drain electrode DE may have a multi-layer structure including a titanium layer, an aluminum layer, and a titanium layer (Ti/Al/Ti) that are stacked (e.g., sequentially stacked).

The storage capacitor Cst may include a lower electrode CE1 and an upper electrode CE2 overlapping each other with a first interlayer insulating layer 205 therebetween. The storage capacitor Cst may overlap the thin-film transistor TFT. In this regard, in FIG. 6, the gate electrode GE of the thin-film transistor TFT is illustrated as the lower electrode CE1 of the storage capacitor Cst. According to another embodiment, the storage capacitor Cst may not overlap the thin-film transistor TFT. The storage capacitor Cst may be covered using a second interlayer insulating layer 207. The upper electrode CE2 of the storage capacitor Cst may include a conductive material including molybdenum (Mo), aluminum (Al), copper (Cu), titanium (Ti), and/or the like, and may have a multi-layer or single-layer structure including the above material.

The first interlayer insulating layer 205 and/or the second interlayer insulating layer 207 may include an inorganic insulating material such as silicon oxide, silicon nitride, silicon oxynitride, aluminum oxide, titanium oxide, tantalum oxide, and/or a hafnium oxide. The first interlayer insulating layer 205 and the second interlayer insulating layer 207 may have a single-layer or a multi-layer structure including the above-described material.

The pixel circuit PC including the thin-film transistor TFT and the storage capacitor Cst may be covered using a first organic insulating layer 209. The first organic insulating layer 209 may have an approximately flat upper surface.

The pixel circuit PC may be connected (e.g., electrically connected) to a pixel electrode 221. For example, as illustrated in FIG. 6, a contact metal layer CM may be between the thin-film transistor TFT and the pixel electrode 221. The contact metal layer CM may contact the thin-film transistor TFT via a contact hole formed in or extending through the first organic insulating layer 209, and the pixel electrode 221 may contact the contact metal layer CM via a contact hole formed in or extending through a second organic insulating layer 211 on the contact metal layer CM. The contact metal layer CM may include a conductive material including molybdenum (Mo), aluminum (Al), copper (Cu), titanium (Ti), and/or the like, and may be formed as a multi-layer or single-layer structure including the above material. According to an embodiment, the contact metal layer CM may include a 2-1st metal layer m2-1, a 2-2nd metal layer m2-2, and a 2-3rd metal layer m2-3 that are stacked (e.g., sequentially stacked). For example, the 2-1st metal layer m2-1 may include titanium, the 2-2nd metal layer m2-2 may include aluminum, and the 2-3rd metal layer m2-3 may include titanium. That is, the contact metal layer CM may have a multi-layer structure including a titanium layer, an aluminum layer, and a titanium layer (Ti/Al/Ti) that are stacked (e.g., sequentially stacked).

The first organic insulating layer 209 and/or the second organic insulating layer 211 may include an organic insulating material such as a general-purpose polymer (e.g., polystyrene (PS) or polymethylmethacrylate (PMMA)), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, and/or a combination thereof. According to an embodiment, the first organic insulating layer 209 and/or the second organic insulating layer 211 may include polyimide.

The pixel electrode 221 may be formed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to an embodiment, the pixel electrode 221 may include a first electrode layer e1, a second electrode layer e2, and a third electrode layer e3 that are stacked (e.g., sequentially stacked). For example, the first electrode layer e1 may include ITO, the second electrode layer e2 may include silver (Ag), and the third electrode layer e3 may include ITO. That is, the pixel electrode 221 may have a multi-layer structure including an ITO layer, an Ag layer, and an ITO layer (ITO/Ag/ITO) that are stacked (e.g., sequentially stacked).

A pixel defining layer 215 may be formed on the pixel electrode 221. The pixel defining layer 215 may have an opening exposing an upper surface of the pixel electrode 221, and may cover edges of the pixel electrode 221. The pixel defining layer 215 may include an organic insulating material. Alternatively, the pixel defining layer 215 may include an inorganic insulating material such as silicon nitride, silicon oxynitride, or silicon oxide. Alternatively, the pixel defining layer 215 may include an organic insulating material and an inorganic insulating material.

An intermediate layer 222 may include an emission layer 222b. The intermediate layer 222 may include a first functional layer 222a arranged under the emission layer 222b and/or a second functional layer 222c arranged on the emission layer 222b. The emission layer 222b may include a polymer or low-molecular weight organic material emitting light of a certain color.

The first functional layer 222a may have a single-layer or multi-layer structure. For example, when the first functional layer 222a is formed of a polymer material, the first functional layer 222a may include a hole transport layer (HTL) having a single-layer structure, and may be formed using poly-(3,4)-ethylene-dihydroxy thiophene (PEDOT) or polyaniline (PANI). When the first functional layer 222a is formed of a low-molecular weight material, the first functional layer 222a may include a hole injection layer (HIL) and an HTL.

The second functional layer 222c may be optionally included. For example, when the first functional layer 222a and the emission layer 222b are formed of a polymer material, the second functional layer 222c may be formed. The second functional layer 222c may have a single-layer or multi-layer structure. The second functional layer 222c may include an electron transport layer (ETL) and/or an electron injection layer (EIL).

The emission layer 222b of the intermediate layer 222 may be arranged in each pixel in the display area DA. The emission layer 222b may be patterned to correspond to the pixel electrode 221. Unlike the emission layer 222b, the first functional layer 222a and/or the second functional layer 222c of the intermediate layer 222 may be located not only in the display area DA but also in the middle area MA, and may be integrally formed on the substrate 100.

The opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 223 may further include a layer such as ITO, IZO, ZnO or $In_2O_3$ on the (semi)transparent layer including the above-described material. The opposite electrode 223 may be integrally formed not only in the display area DA but also in the middle area MA. The first functional layer 222a, the second functional layer 222c, and the opposite electrode 223 may be formed using any suitable method such as, for example, a thermal deposition method.

A capping layer may be on the opposite electrode 223. The capping layer may include a LiF layer, and may be formed using any suitable method such as, for example, a thermal deposition method. In an embodiment, the capping layer may be omitted.

The intermediate layer 222 and/or the opposite electrode 223 may extend from the display area DA to the middle area MA. In an embodiment, the intermediate layer 222 and/or the opposite electrode 223 may be arranged over the entire surfaces of the display area DA and the middle area MA. The intermediate layer 222 and/or the opposite electrode 223 may be disconnected at or by the disconnection portion 600 (e.g., at least at a point of the disconnection portion 600) which will be described in more detail below. In an embodiment, the intermediate layer 222 and/or the opposite electrode 223 may not extend continuously across the disconnection portion 600 in a plan view.

A spacer 217 may be formed on the pixel defining layer 215. The spacer 217 may include an organic insulating material such as polyimide. Alternatively, the spacer 217 may include an inorganic insulating material or include an organic insulating material and an inorganic insulating material.

The spacer 217 may include a different material from that of the pixel defining layer 215 or a same material as that of the pixel defining layer 215. In an embodiment, the pixel defining layer 215 and the spacer 217 may include polyimide. The pixel defining layer 215 and the spacer 217 may be formed together in a mask process using a halftone mask.

The organic light-emitting diode OLED may be covered using the encapsulation layer 300. The encapsulation layer 300 may include at least one organic encapsulation layer and at least one inorganic encapsulation layer, and FIG. 6 illustrates that the encapsulation layer 300 includes first and second inorganic encapsulation layers 310 and 330 and an organic encapsulation layer 320 therebetween. In another embodiment, a number of organic encapsulation layers and a number of inorganic encapsulation layers and a stacking order thereof may be modified in a suitable manner.

The first inorganic encapsulation layer 310 and the second inorganic encapsulation layer 330 may include at least one inorganic material selected from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or a multi-layer structure including the above-described material. The organic encapsulation layer 320 may include a polymer-based material. Examples of the polymer-based material may include an acrylic resin such as polymethacrylate or a polyacrylic acid, an epoxy resin, polyimide, and polyethylene. According to an embodiment, the organic encapsulation layer 320 may include an acrylate polymer.

A material of the first inorganic encapsulation layer 310 may be different from a material of the second inorganic encapsulation layer 330. For example, the first inorganic encapsulation layer 310 may include silicon oxynitride, and the second inorganic encapsulation layer 330 may include silicon nitride. A thickness of the first inorganic encapsulation layer 310 may be different from that of the second inorganic encapsulation layer 330. A thickness of the first inorganic encapsulation layer 310 may be greater than that of the second inorganic encapsulation layer 330. Alternatively, a thickness of the second inorganic encapsulation layer 330 may be greater than that of the first inorganic encapsulation layer 310. In an embodiment, the first inorganic encapsulation layer 310 and the second inorganic encapsulation layer 330 may have a same thickness.

Referring to the middle area MA of FIG. 6, one or more disconnection portions 600 may be arranged in the middle area MA. The intermediate layer 222 and the opposite electrode 223 may be disconnected (or separated) at the disconnection portion 600 (e.g., at least a point of the disconnection portion 600). For example, the first functional layer 222a, the second functional layer 222c, and/or the opposite electrode 223 may be disconnected by the disconnection portion 600. In an embodiment, the first functional layer 222a, the second functional layer 222c, and/or the opposite electrode 223 may not extend continuously across the disconnection portion 600 in a plan view. The disconnection portion 600 will be described in more detail below with reference to FIGS. 8A-12.

A partition wall PW may be in the middle area MA. The partition wall PW may include a plurality of partition wall layers that are stacked (e.g., sequentially stacked). According to an embodiment, as illustrated in FIG. 6, the partition wall PW may include a first partition wall layer PW1, a second partition wall layer PW2, and a third partition wall layer PW3. The first partition wall layer PW1 may include a same material as and a same layer structure as the first organic insulating layer 209, the second partition wall layer PW2 may include a same material as and a same layer structure as the second organic insulating layer 211, and the third partition wall layer PW3 may include a same material as and a same layer structure as the pixel defining layer 215 and/or the spacer 217.

The partition wall PW may be apart from (e.g., spaced from) the disconnection portion 600. Also, the partition wall PW may be around (e.g., entirely surround) the opening area OA like the disconnection portion 600 described above with reference to FIG. 5. In an embodiment, the disconnection portion 600 may be between the partition wall PW and the opening area OA.

The encapsulation layer 300 may also be located in the middle area MA. The first inorganic encapsulation layer 310 and the second inorganic encapsulation layer 330 may have better step coverage than the first functional layer 222a, the second functional layer 222c, the opposite electrode 223, and/or the capping layer. The first inorganic encapsulation layer 310 and the second inorganic encapsulation layer 330 may be continuously formed as illustrated in FIG. 6. For example, the first inorganic encapsulation layer 310 and the second inorganic encapsulation layer 330 may continuously and entirely cover a side surface and/or an upper surface of the disconnection portion 600 according to a shape of the disconnection portion 600. The first inorganic encapsulation layer 310 and the second inorganic encapsulation layer 330 may be formed using any suitable method such as, for example, a chemical vapor deposition method.

The input sensing layer 40 may be located on the display panel 10.

The input sensing layer 40 may include a first insulating layer 410, a second insulating layer 420, a third insulating layer 440, and a fourth insulating layer 460 that are stacked (e.g., sequentially stacked). Also, the input sensing layer 40 may include a first conductive layer 430 between the second insulating layer 420 and the third insulating layer 440 and a second conductive layer 450 between the third insulating layer 440 and the fourth insulating layer 460. The first conductive layer 430 and/or the second conductive layer 450 may include touch electrodes for sensing a touch input and trace lines connected to the touch electrodes.

The first insulating layer 410, the second insulating layer 420, the third insulating layer 440, and the fourth insulating layer 460 may be integrally formed to be located in the display area DA and the middle area MA. The first insulating layer 410, the second insulating layer 420, and the third insulating layer 440 may include an inorganic insulating material such as silicon oxide, silicon nitride, or silicon oxynitride, and the fourth insulating layer 460 may include an organic insulating material. For example, the organic insulating material of the fourth insulating layer 460 may include a photoresist (negative or positive) or a polymer-based organic material.

The first conductive layer 430 and/or the second conductive layer 450 may include (or may each include) a metal or a transparent conductive oxide (TCO). In some embodiments, the first conductive layer 430 and/or the second conductive layer 450 may include (or may each include) a conductive material including molybdenum (Mo), aluminum (Al), copper (Cu), titanium (Ti), and/or the like.

A planarization layer 415 may be an organic insulating layer. The planarization layer 415 may include a polymer-based material. For example, the planarization layer 415 may include a silicon-based resin, an acrylic resin, an epoxy resin, polyimide, and polyethylene, and/or the like. The planarization layer 415 may include a different material from that of the organic encapsulation layer 320.

The organic encapsulation layer 320 may be located at one side of the partition wall PW, and an area of the middle area MA that is not covered by the organic encapsulation layer 320 may be covered by the planarization layer 415. A portion of the organic encapsulation layer 320 may overlap the planarization layer 415. As the planarization layer 415 is located in the area of the middle area MA that is not covered by the organic encapsulation layer 320, a level of flatness of the display panel 10 may be increased around the opening 10H. Accordingly, exfoliation of the input sensing layer 40 and/or the optical functional layer 50 of the display panel 10 may be prevented or reduced.

The planarization layer 415 may cover upper portions of the disconnection portions 600 in the middle area MA. The planarization layer 415 may be between any two insulating layers selected from among the second inorganic encapsulation layer 330, the first insulating layer 410, the second insulating layer 420, the third insulating layer 440, and the fourth insulating layer 460 in the middle area MA.

According to an embodiment, as illustrated in FIG. 6, the planarization layer 415 may be between the first insulating layer 410 and the second insulating layer 420 in the middle area MA. In this case, the second inorganic encapsulation layer 330 and the first insulating layer 410 may be between the organic encapsulation layer 320 and the planarization layer 415 that overlap each other.

According to another embodiment, as illustrated in FIG. 7, the planarization layer 415 may be between the third insulating layer 440 and the fourth insulating layer 460 in the middle area MA. In this case, the first through third insulating layers (i.e., the first insulating layer 410, the second insulating layer 420, and the third insulating layer 440) may cover an upper surface of the encapsulation layer 300 covering the disconnection portions 600.

Figure 8A:
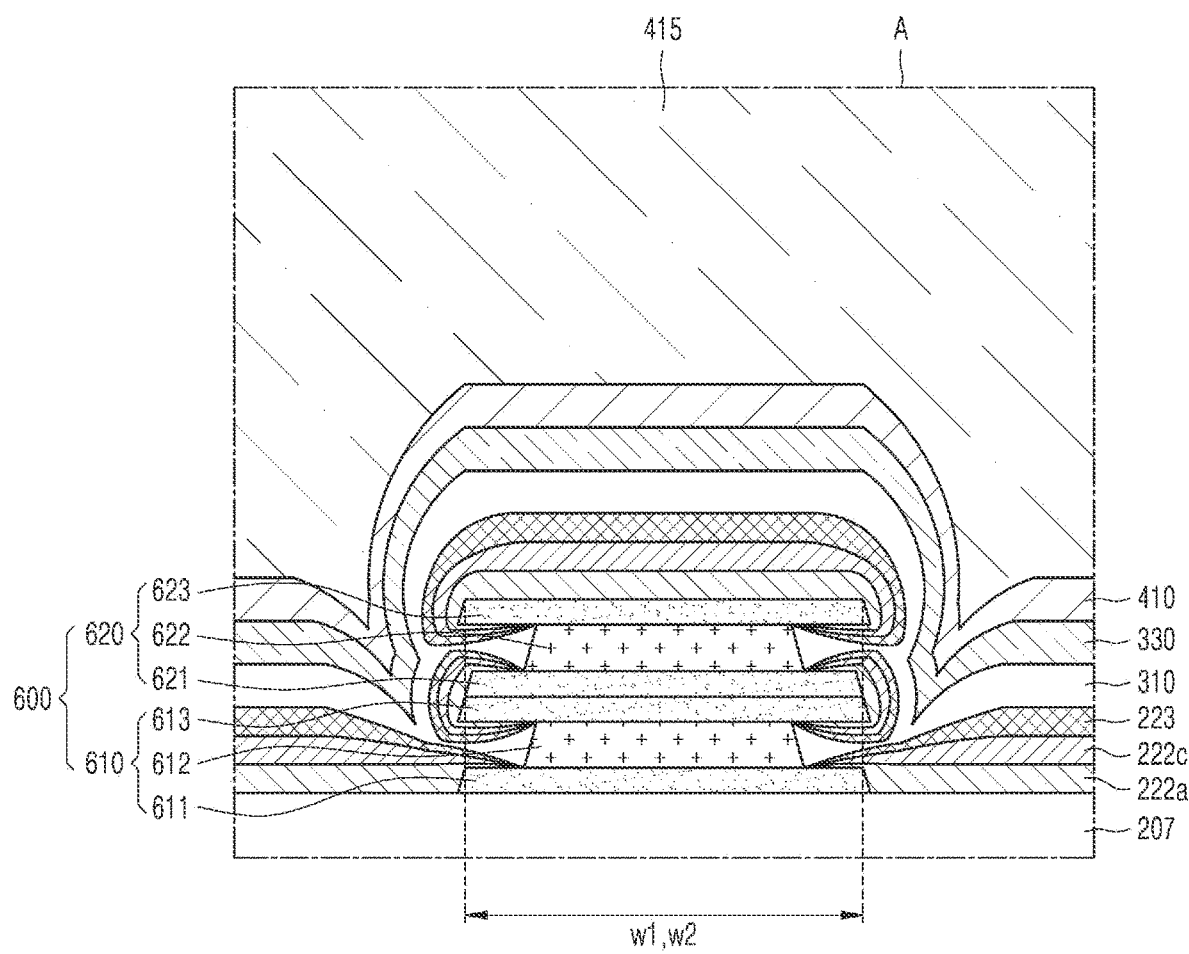
FIG. 8A is a schematic cross-sectional view of a portion of a disconnection portion according to an embodiment.
Figure 8B:
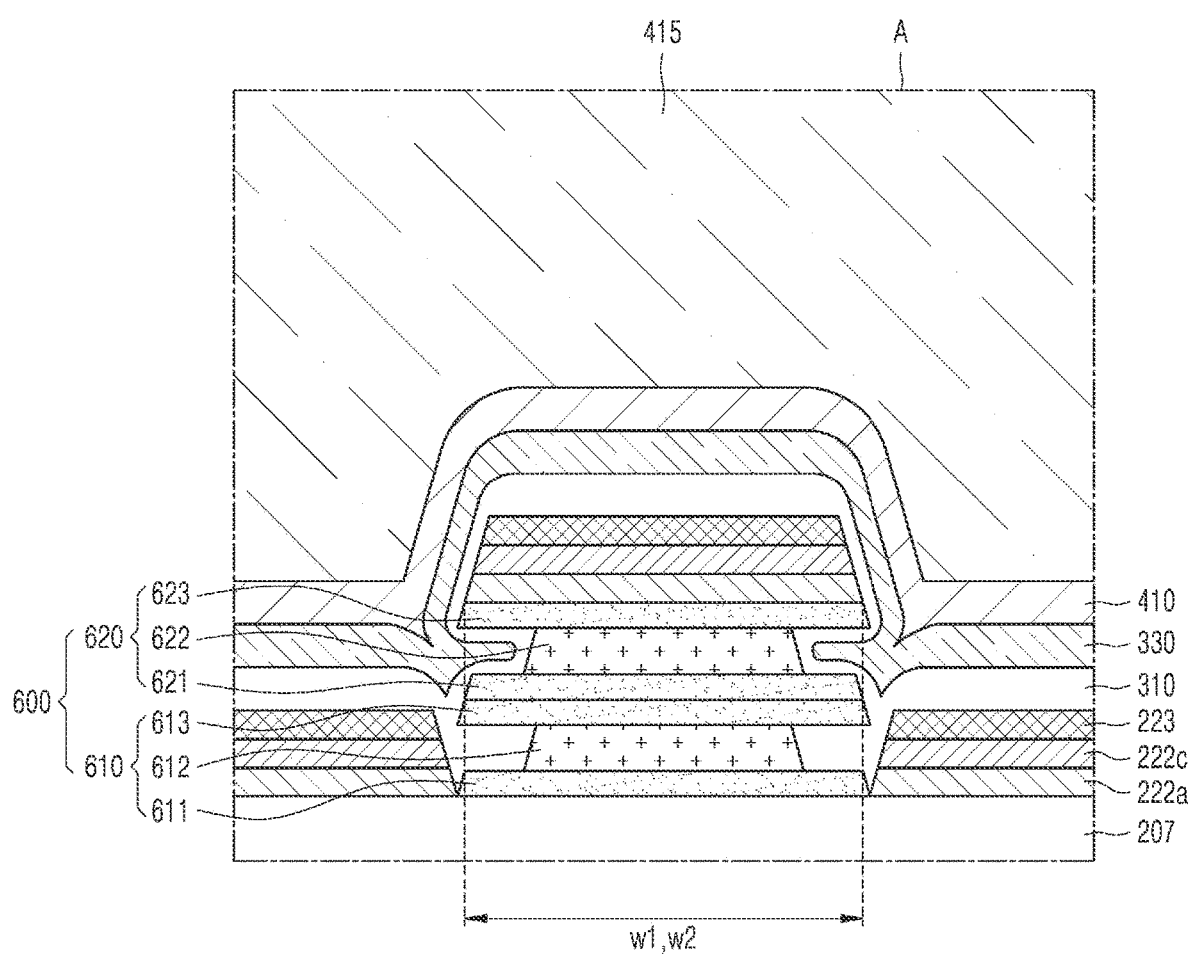
FIG. 8B is a schematic cross-sectional view of a portion of a disconnection portion according to another embodiment.

FIG. 8A is a schematic cross-sectional view of a portion of a disconnection portion according to an embodiment, and FIG. 8B is a schematic cross-sectional view of a portion of a disconnection portion according to another embodiment. For reference, FIGS. 8A-12 may correspond to enlarged cross-sectional views of region A of the disconnection portion 600 of FIG. 6.

The disconnection portion 600 may have at least one stack structure in each of which a plurality of sub-layers are stacked. According to an embodiment, as illustrated in FIG. 8A, the disconnection portion 600 may have a first stack structure 610 in which a 1-1st sub-layer 611, a 1-2nd sub-layer 612, and a 1-3rd sub-layer 613 are stacked (e.g., sequentially stacked) and a second stack structure 620 in which a 2-1st sub-layer 621, a 2-2nd sub-layer 622, and a 2-3rd sub-layer 623 are stacked (e.g., sequentially stacked).

Each stack structure may have a shape disconnecting a portion of the intermediate layer 222 and/or the opposite electrode 223 covering the disconnection portion 600. In more detail, each stack structure may have concave portions formed in a side surface thereof toward the opening area OA and a side surface thereof away from the opening area OA.

Referring to FIGS. 8A and 8B, the first stack structure 610 may have a first concave portion formed as the 1-2nd sub-layer 612 is dented, depressed, or recessed toward a center of the 1-2nd sub-layer 612. Each of the 1-1st sub-layer 611 and the 1-3rd sub-layer 613 may protrude further than the 1-2nd sub-layer 612 toward the opening area OA and away from the opening area OA to form a tip. In this case, a width (e.g., a width in the width direction or x-direction) of the 1-2nd sub-layer 612 may be less than that of each of the 1-1st sub-layer 611 and that of the 1-3rd sub-layer 613. Likewise, the second stack structure 620 may have a second concave portion formed as the 2-2nd sub-layer 622 is dented, depressed, or recessed toward a center of the 2-2nd sub-layer 622. Each of the 2-1st sub-layer 621 and the 2-3rd sub-layer 623 may protrude further than the 2-2nd sub-layer 622 toward the opening area OA and away from the opening area OA to form a tip. In this case, a width (e.g., a width in the width direction or x-direction) of the 2-2nd sub-layer 622 may be less than that of each of the 2-1st sub-layer 621 and that of the 2-3rd sub-layer 623.

The disconnection portion 600 may be formed by etching, for example, an isotropic etching process, and concave portions may be formed according to an etching ratio between sub-layers. For example, the 1-2nd sub-layer 612 of the first stack structure 610 may include a material having a higher etching rate than the 1-1st sub-layer 611 and the 1-3rd sub-layer 613 and thus may be etched more and dented, depressed, or recessed toward the center of the 1-2nd sub-layer 612. Likewise, the 2-2nd sub-layer 622 of the second stack structure 620 may include a material having a higher etching rate than the 2-1st sub-layer 621 and the 2-3rd sub-layer 623 and thus may be etched more and dented, depressed, or recessed toward the center of the 2-2nd sub-layer 622.

Sub-layers including a material having a relatively high etch rate may be exposed in a subsequent process and be additionally etched. For example, the 1-2nd sub-layer 612 of the first stack structure 610 may include aluminum (Al) as a material having a relatively high etch rate, and the 1-1st sub-layer 611 and the 1-3rd sub-layer 613 of the first stack structure 610 may include titanium (Ti) as a material having a relatively low etch rate. In this case, in an etching operation of patterning the pixel electrode 221 in a subsequent process, the 1-2nd sub-layer 612 including aluminum (Al) may be additionally etched, whereas the 1-1st sub-layer 611 and the 1-3rd sub-layer 613 including titanium (Ti) may not be additionally etched. Accordingly, the 1-2nd sub-layer 612 may have a shape that is further dented, depressed, or recessed toward the center of the 1-2nd sub-layer 612. The differential additional etching of sub-layers exposed in a subsequent process due to the difference in the etch rates between the sub-layers may also apply to the second stack structure 620 and a third stack structure 630 (e.g., see FIG. 10).

According to an embodiment, the first stack structure 610 may include a same material as and a same layer structure as the source electrode SE and the drain electrode DE described above. For example, when each of the source electrode SE and the drain electrode DE includes the 1-1st metal layer m1-1, the 1-2nd metal layer m1-2, and the 1-3rd metal layer m1-3 that are stacked (e.g., sequentially stacked), the 1-1st sub-layer 611 may include a same material as and have a same layer structure as the 1-1st metal layer m1-1, and the 1-2nd sub-layer 612 may include a same material as and have a same layer structure as the 1-2nd metal layer m1-2, and the 1-3rd sub-layer 613 may include a same material as and have a same layer structure as the 1-3rd metal layer m1-3. For example, the 1-1st sub-layer 611 may include titanium (Ti), the 1-2nd sub-layer 612 may include aluminum (Al), and the 1-3rd sub-layer 613 may include titanium (Ti).

Also, the second stack structure 620 may include a same material and a same layer structure as the contact metal layer CM described above. For example, when the contact metal layer CM includes the 2-1st metal layer m2-1, the 2-2nd metal layer m2-3, and the 2-3rd metal layer m2-3 that are stacked (e.g., sequentially stacked), the 2-1st sub-layer 621 may include a same material as and have a same layer structure as the 2-1st metal layer m2-1, the 2-2nd sub-layer 622 may include a same material as and have a same layer structure as the 2-2nd metal layer m2-2, and the 2-3rd sub-layer 623 may include a same material as and have a same layer structure as the 2-3rd metal layer m2-3. For example, the 2-1st sub-layer 621 may include titanium (Ti), the 2-2nd sub-layer 622 may include aluminum (Al), and the 2-3rd sub-layer 623 may include titanium (Ti).

While a boundary between the 1-3rd sub-layer 613 and the 2-1st sub-layer 621 that contact each other is illustrated clearly in FIGS. 8A and 8B, the present disclosure is not limited thereto. For example, when the 1-3rd sub-layer 613 and the 2-1st sub-layer 621 that contact each other include a same material as each other, a boundary between the two layers may not be clear or the two layers may be integrally formed.

The disconnection portion 600 having the above-described structure may be formed before an operation of forming the intermediate layer 222 and the opposite electrode 223. A layer including an organic material, selected from among the layers formed on the substrate 100, may act as a path through which moisture proceeds. For example, when the display panel 10 includes the opening 10H as illustrated in FIG. 6, moisture may proceed in a direction parallel to an upper surface of the substrate 100. For example, moisture may proceed in a direction parallel to an upper surface of the substrate 100 through one or more layers including an organic material. However, according to the embodiments, organic material layers, for example, the first functional layer 222a and/or the second functional layer 222c, may (e.g., may each) be disconnected or separated via the disconnection portion 600. The first functional layer 222a and/or the second functional layer 222c may (e.g., may each) be formed using any suitable method such as, for example, a thermal deposition method, and when depositing the first functional layer 222a and/or the second functional layer 222c, due to a tip of a stack structure (e.g., a first stack structure, a second stack structure, and/or a third stack structure), the first functional layer 222a and/or the second functional layer 222c may (e.g., may each) be discontinuously formed. Similarly, the opposite electrode 223 and/or the LiF layer of the capping layer may (e.g., may each) also be formed using a thermal deposition method, and may be discontinuously formed by the disconnection portion 600.

According to an embodiment, as illustrated in FIG. 8A, layers having poor step coverage may have a smaller thickness (e.g., a thickness that decreases) toward inner portions of the concave portions and may be disconnected in at least one of the concave portions (e.g., in a space defined by the at least one concave portion). For example, the intermediate layer 222 and/or the opposite electrode 223, or the like that cover a stack structure to extend have poor step coverage compared to the first inorganic encapsulation layer 310 and the second inorganic encapsulation layer 330, and thus may have a smaller thickness (e.g., a thickness that decreases) toward the inner portions of the concave portions and may be disconnected in an inner portion of at least one of the concave portions (e.g., in a space defined by the at least one concave portion) and discontinuously formed. For example, the intermediate layer 222 and/or the opposite electrode 223 may have a smaller thickness (e.g., a thickness that decreases) toward an inner portion of the first concave portion of the first stack structure 610 or an inner portion of the second concave portion of the second stack structure 620 and then may be disconnected. On the other hand, the first inorganic encapsulation layer 310, the second inorganic encapsulation layer 330, and the first insulating layer 410 that have relatively good step coverage may (e.g., may each) be continuously formed along a shape of the disconnection portion 600.

According to another embodiment, as illustrated in FIG. 8B, the intermediate layer 222 and/or the opposite electrode 223 may (e.g., may each) be disconnected by a tip formed in an upper portion and a lower portion of a concave portion. For example, referring to FIG. 8B, the intermediate layer 222 and the opposite electrode 223 may (e.g., may each) cover an upper surface of the 2-3rd sub-layer 623 which is an upper surface of the disconnection portion 600 and may (e.g., may each) be disconnected via tips at two ends of the 2-3rd sub-layer 623 to be discontinuously formed. On the other hand, the first inorganic encapsulation layer 310, the second inorganic encapsulation layer 330, and the first insulating layer 410 that have relatively good step coverage may (e.g., may each) be continuously formed along the shape of the disconnection portion 600.

FIGS. 9-12 below are illustrated based on layers having poor step coverage and thus having a smaller thickness (e.g., a thickness that decreases) toward an inner portion of concave portions and being disconnected in an inner portion of at least one of the concave portions (e.g., in a space defined by the at least one concave portion), like FIG. 8A. However, in structures to be described below, layers covering the disconnection portion 600 may also be formed like FIG. 8B.

Figure 9:
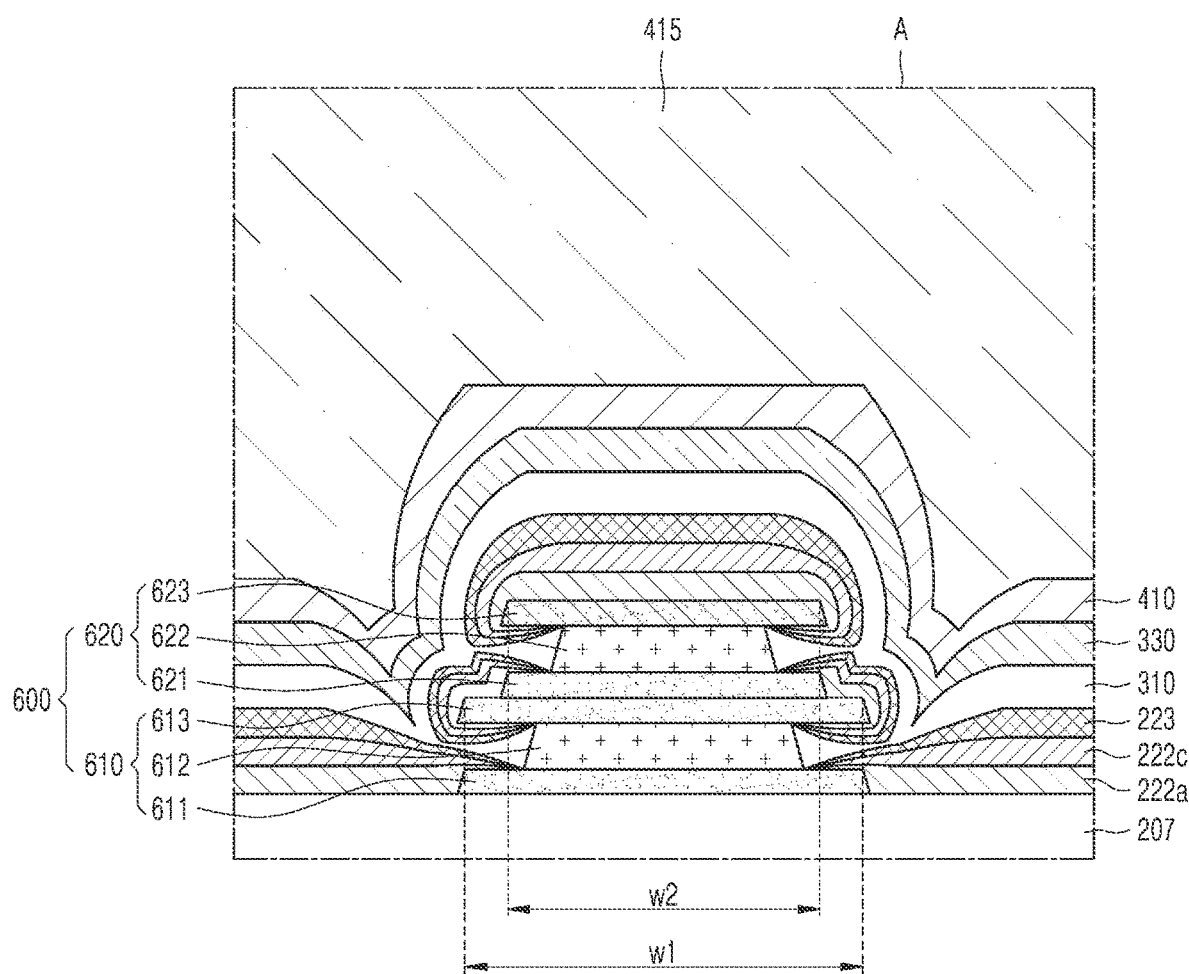
FIG. 9 is a schematic cross-sectional view of a portion of a disconnection portion according to another embodiment.

FIG. 9 is a schematic cross-sectional view of a portion of a disconnection portion according to another embodiment. FIG. 9 is different from FIG. 8A only in respect to a relationship about widths of stack structures.

In the embodiment of FIG. 8A described above, a width w1 of the first stack structure 610 is equal (e.g., equal in the width direction or x-direction) to a width w2 of the second stack structure 620, but the present disclosure is not limited thereto. The width w1 of the first stack structure 610 may denote a width of an upper surface of the 1-1st sub-layer 611 or a width of an upper surface of the 1-3rd sub-layer 613, and the width w2 of the second stack structure 620 may denote a width of an upper surface of the 2-1st sub-layer 621 or a width of the upper surface of the 2-3rd sub-layer 623. For example, as in the embodiment illustrated in FIG. 9, the width w2 of the second stack structure 620 may be less (e.g., less in the width direction or x-direction) than the width w1 of the first stack structure 610. Also, unlike FIG. 9, the width w2 of the second stack structure 620 may be greater (e.g., greater in the width direction or x-direction) than the width w1 of the first stack structure 610.

Figure 10:
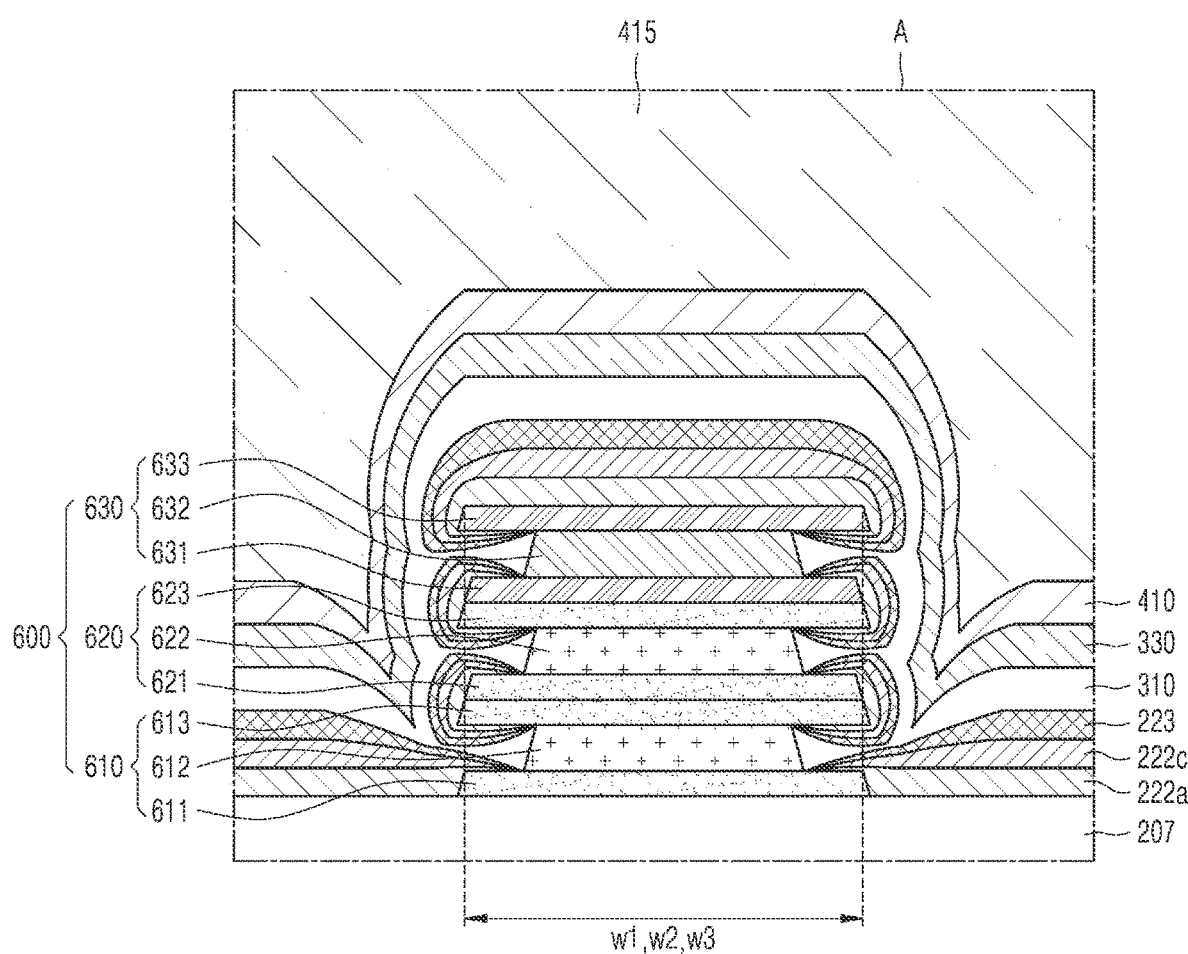
FIG. 10 is a schematic cross-sectional view of a portion of a disconnection portion according to another embodiment.
Figure 11:
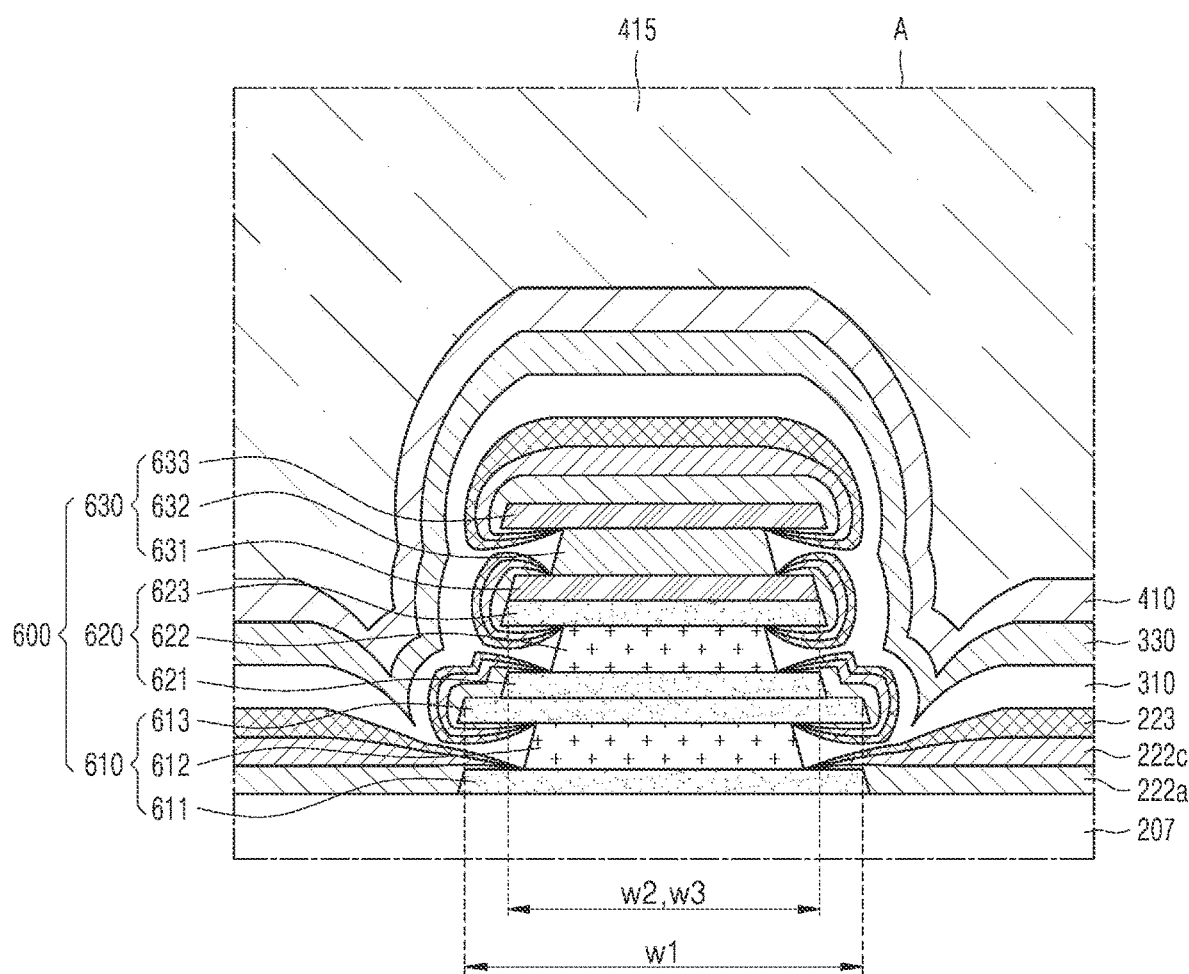
FIG. 11 is a schematic cross-sectional view of a portion of a disconnection portion according to another embodiment.
Figure 12:
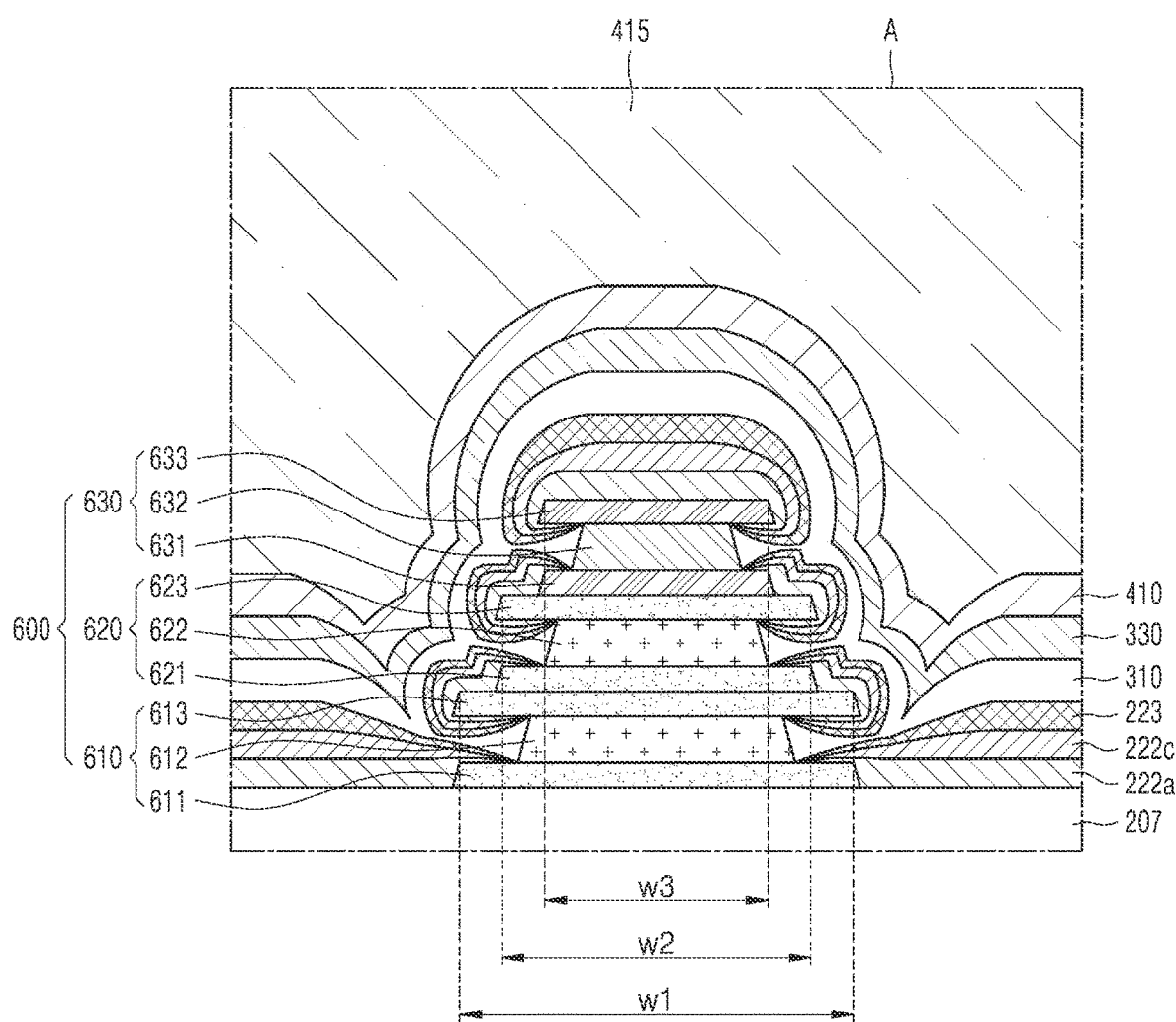
FIG. 12 is a schematic cross-sectional view of a portion of a disconnection portion according to another embodiment.

FIGS. 10-12 are schematic cross-sectional views of a portion of a disconnection portion according to embodiments. In more detail, FIGS. 10-12 are schematic cross-sectional views illustrating a portion of the disconnection portion 600 further including the third stack structure 630.

As illustrated in FIGS. 10-12, the disconnection portion 600 may include the first stack structure 610 located on the substrate 100 (e.g., see FIG. 6), the second stack structure 620 located on the first stack structure 610, and the third stack structure 630 located on the second stack structure 620. The third stack structure 630 may include a 3-1st sub-layer 631, a 3-2nd sub-layer 632, and a 3-3rd sub-layer 633 that are stacked (e.g., sequentially stacked).

The third stack structure 630 may have a third concave portion that is formed as the 3-2nd sub-layer 632 is dented, depressed, or recessed toward a center of the 3-2nd sub-layer 632, like the first stack structure 610 and the second stack structure 620. Description of the structural characteristics and effect of the third concave portion may be replaced by the description of the first concave portion of the first stack structure 610 and the second concave portion of the second stack structure 620 provided above, and therefore, a description thereof may not be repeated.

According to the present embodiment, the intermediate layer 222 and/or the opposite electrode 223 may have a smaller thickness (e.g., a thickness that decreases) toward the inner portion of the first concave portion of the first stack structure 610, the inner portion of the second concave portion of the second stack structure 620, and an inner portion of the third concave portion of the third stack structure 630 and then be disconnected. As the disconnection portion 600 further includes the third stack structure 630, a number of concave portions is increased, and accordingly, the intermediate layer 222 and/or the opposite electrode 223 may be effectively disconnected.

According to an embodiment, the third stack structure 630 may include a same material and a same layer structure as the pixel electrode 221 described above. For example, when the pixel electrode 221 includes the first electrode layer e1, the second electrode layer e2, and the third electrode layer e3 that are stacked (e.g., sequentially stacked), the 3-1st sub-layer 631 may include a same material as and a same layer structure as the first electrode layer e1, and the 3-2nd sub-layer 632 may include a same material as and a same layer structure as the second electrode layer e2, and the 3-3rd sub-layer 633 may include a same material as and a same layer structure as the third electrode layer e3. For example, the 3-1st sub-layer 631 may include ITO, the 3-2nd sub-layer 632 may include silver (Ag), and the 3-3rd sub-layer 633 may include ITO.

Meanwhile, as illustrated in FIG. 10, the width w1 of the first stack structure 610, the width w2 of the second stack structure 620, and a width w3 of the third stack structure 630 may be equal (e.g., equal in the width direction or x-direction) to each other, but are not limited thereto. For example, as illustrated in FIG. 11, the width w2 of the second stack structure 620 and the width w3 of the third stack structure 630 may be less (e.g., less in the width direction or x-direction) than the width w1 of the first stack structure 610. Also, as illustrated in FIG. 12, the width w3 of the third stack structure 630 may be less (e.g., less in the width direction or x-direction) than the width w2 of the second stack structure 620, and the width w2 of the second stack structure 620 may be less than the width w1 of the first stack structure 610.

While a display apparatus has been mainly described above, the present disclosure is not limited thereto. For example, a method of manufacturing the display apparatus is also included in the scope of the present disclosure.

According to the embodiment as described above, a display apparatus having improved moisture permeation-prevention performance may be implemented. However, the scope of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
    a substrate having an opening, a display area around the opening, and a middle area between the opening and the display area;
    a light-emitting element in the display area, the light-emitting element comprising a pixel electrode, an opposite electrode, and an intermediate layer between the pixel electrode and the opposite electrode; and
    a disconnection portion in the middle area, the disconnection portion comprising a first stack structure and a second stack structure on the first stack structure,
    wherein a 1-1st sub-layer, a 1-2nd sub-layer, and a 1-3rd sub-layer are sequentially stacked in the first stack structure,
    wherein a 2-1st sub-layer, a 2-2nd sub-layer, and a 2-3rd sub-layer are sequentially stacked in the second stack structure,
    wherein the intermediate layer and the opposite electrode extend from the display area to the middle area, the intermediate layer and the opposite electrode being disconnected at the disconnection portion,
    wherein the first stack structure has a first concave portion in which the 1-2nd sub-layer is dented toward a center of the 1-2nd sub-layer,
    wherein the second stack structure has a second concave portion in which the 2-2nd sub-layer is dented toward a center of the 2-2nd sub-layer, and
    wherein the intermediate layer and the opposite electrode each have a thickness that decreases toward an inner portion of the first concave portion or an inner portion of the second concave portion.

2. The display apparatus of claim 1, wherein the intermediate layer and the opposite electrode are disconnected in the inner portion of the first concave portion or the inner portion of the second concave portion.

3. The display apparatus of claim 2, wherein the intermediate layer comprises at least one of a hole transport layer, a hole injection layer, an electron transport layer, or an electron injection layer.

4. The display apparatus of claim 1, wherein a width of the 1-2nd sub-layer is less than a width of the 1-1st sub-layer and a width of the 1-3rd sub-layer, and
    wherein a width of the 2-2nd sub-layer is less than a width of the 2-1st sub-layer and a width of the 2-3rd sub-layer.

5. The display apparatus of claim 1, further comprising a thin-film transistor in the display area, the thin-film transistor comprising a semiconductor layer, a gate electrode overlapping the semiconductor layer, and a source electrode and a drain electrode that are electrically connected to the semiconductor layer,
    wherein at least one of the source electrode or the drain electrode comprises a 1-1st metal layer, a 1-2nd metal layer on the 1-1st metal layer, and a 1-3rd metal layer on the 1-2nd metal layer.

6. The display apparatus of claim 5, wherein the 1-1st sub-layer and the 1-1st metal layer comprise a same material as each other,
    wherein the 1-2nd sub-layer and the 1-2nd metal layer comprise a same material as each other, and
    wherein the 1-3rd sub-layer and the 1-3rd metal layer comprise a same material as each other.

7. The display apparatus of claim 5, further comprising a contact metal layer on the thin-film transistor, the contact metal layer electrically connected to the source electrode or the drain electrode, wherein the contact metal layer comprises a 2-1st metal layer, a 2-2nd metal layer on the 2-1st metal layer, and a 2-3rd metal layer on the 2-2nd metal layer.

8. The display apparatus of claim 7, wherein the 2-1st sub-layer and the 2-1st metal layer comprise a same material as each other,
wherein the 2-2nd sub-layer and the 2-2nd metal layer comprise a same material as each other, and
wherein the 2-3rd sub-layer and the 2-3rd metal layer comprise a same material as each other.

9. The display apparatus of claim 1, wherein the disconnection portion further comprises a third stack structure on the second stack structure, and
wherein a 3-1st sub-layer, a 3-2nd sub-layer, and a 3-3rd sub-layer are sequentially stacked in the third stack structure.

10. The display apparatus of claim 9,
wherein the third stack structure has a third concave portion in which the 3-2nd sub-layer is dented toward a center of the 3-2nd sub-layer.

11. The display apparatus of claim 10, wherein the intermediate layer and the opposite electrode are disconnected in the inner portion of the first concave portion, the inner portion of the second concave portion, or an inner portion of the third concave portion.

12. The display apparatus of claim 11, wherein each of the thickness of the intermediate layer and the thickness of the opposite electrode decrease toward the inner portion of the first concave portion, the inner portion of the second concave portion, and the inner portion of the third concave portion.

13. The display apparatus of claim 10, wherein a width of the 1-2nd sub-layer is less than a width of the 1-1st sub-layer and a width of the 1-3rd sub-layer,
wherein a width of the 2-2nd sub-layer is less than a width of the 2-1st sub-layer and a width of the 2-3rd sub-layer, and
wherein a width of the 3-2nd sub-layer is less than a width of the 3-1st sub-layer and a width of the 3-3rd sub-layer.

14. The display apparatus of claim 13, wherein the width of the 2-1st sub-layer is less than the width of the 1-3rd sub-layer.

15. The display apparatus of claim 14, wherein the width of the 3-1st sub-layer is less than the width of the 2-3rd sub-layer.

16. The display apparatus of claim 9, wherein the pixel electrode comprises a first electrode layer, a second electrode layer on the first electrode layer, and a third electrode layer on the second electrode layer.

17. The display apparatus of claim 16, wherein the first electrode layer and the 3-1st sub-layer comprise a same material as each other,
wherein the second electrode layer and the 3-2nd sub-layer comprise a same material as each other, and
wherein the third electrode layer and the 3-3rd sub-layer comprise a same material as each other.

18. A display apparatus comprising:
a substrate having an opening, a display area around the opening, and a middle area between the opening and the display area;
a light-emitting element in the display area, the light-emitting element comprising a pixel electrode, an opposite electrode, and an intermediate layer between the pixel electrode and the opposite electrode; and
a disconnection portion in the middle area, the disconnection portion comprising a first stack structure and a second stack structure on the first stack structure,
wherein a 1-1st sub-layer, a 1-2nd sub-layer, and a 1-3rd sub-layer are sequentially stacked in the first stack structure,
wherein a 2-1st sub-layer, a 2-2nd sub-layer, and a 2-3rd sub-layer are sequentially stacked in the second stack structure, and
wherein the intermediate layer and the opposite electrode extend from the display area to the middle area, the intermediate layer and the opposite electrode being disconnected at the disconnection portion,
wherein a width of the 2-1st sub-layer is less than a width of the 1-3rd sub-layer.

* * * * *